(12) United States Patent
Choi et al.

(10) Patent No.: US 11,615,855 B2
(45) Date of Patent: Mar. 28, 2023

(54) NONVOLATILE MEMORY DEVICE AND METHOD OF PROGRAMMING IN A NONVOLATILE MEMORY

(71) Applicant: Samsung Electronics Co., Ltd., Suwon-si (KR)

(72) Inventors: Yonghyuk Choi, Suwon-si (KR); Sangwan Nam, Hwaseong-si (KR); Jaeduk Yu, Seoul (KR); Yohan Lee, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/334,045

(22) Filed: May 28, 2021

(65) Prior Publication Data

US 2022/0130474 A1   Apr. 28, 2022

(30) Foreign Application Priority Data

Oct. 26, 2020  (KR) .......................... 10-2020-0139081

(51) Int. Cl.
*G11C 16/04*   (2006.01)
*G11C 16/34*   (2006.01)
(Continued)

(52) U.S. Cl.
CPC ...... *G11C 16/3427* (2013.01); *G11C 16/0483* (2013.01); *G11C 16/08* (2013.01);
(Continued)

(58) Field of Classification Search
CPC . G11C 16/3427; G11C 16/0483; G11C 16/08; G11C 16/10; G11C 16/24
See application file for complete search history.

(56) References Cited

U.S. PATENT DOCUMENTS 6,483,744 B2 * 11/2002 Kim .................... G11C 11/5642
                                                          365/185.25
7,619,933 B2  11/2009 Sarin
(Continued)

OTHER PUBLICATIONS

Extended European Search Report dated Mar. 29, 2022 issued in corresponding European Patent Application No. 21178135.6-1203.
(Continued)

*Primary Examiner* — Pho M Luu
(74) *Attorney, Agent, or Firm* — Harness, Dickey & Pierce, P.L.C.

(57) ABSTRACT

A nonvolatile memory device includes at least one memory block and a control circuit. The at least one memory block includes a plurality of cell strings, each including a string selection transistor, a plurality of memory cells and a ground selection transistor. The control circuit controls a program operation by precharging channels of the plurality of cell strings to a first voltage during a bit-line set-up period of a program loop, applying a program voltage to a selected word-line of the plurality of cell strings during a program execution period of the program loop and after recovering voltages of the selected word-line and unselected word-lines of the plurality of cell strings to a negative voltage smaller than a ground voltage, recovering the voltages of the selected word-line and the unselected word-lines to a second voltage greater than the ground voltage during a recovery period of the program loop.

20 Claims, 28 Drawing Sheets

(51) Int. Cl.
*G11C 16/08* (2006.01)
*G11C 16/10* (2006.01)
*G11C 16/24* (2006.01)
*H01L 23/00* (2006.01)
*H01L 25/065* (2023.01)
*H01L 25/18* (2023.01)
*H01L 27/11556* (2017.01)
*H01L 27/11582* (2017.01)

(52) U.S. Cl.
CPC .............. *G11C 16/10* (2013.01); *G11C 16/24* (2013.01); *H01L 24/08* (2013.01); *H01L 25/0657* (2013.01); *H01L 25/18* (2013.01); *H01L 27/11556* (2013.01); *H01L 27/11582* (2013.01); *H01L 2224/08145* (2013.01); *H01L 2924/1431* (2013.01); *H01L 2924/14511* (2013.01)

(56) References Cited

U.S. PATENT DOCUMENTS

| | | | |
|---|---|---|---|
| 7,995,394 B2 | 8/2011 | Dong et al. | |
| 8,593,877 B2 | 11/2013 | Joo | |
| 8,705,273 B2 | 4/2014 | Kim et al. | |
| RE45,520 E | 5/2015 | Dutta et al. | |
| 9,087,601 B2 | 7/2015 | Dutta et al. | |
| 9,424,947 B2 | 8/2016 | Kwak et al. | |
| 9,761,291 B2 * | 9/2017 | Joo | G11C 16/10 |
| 9,870,825 B2 * | 1/2018 | Nam | G11C 16/10 |
| 9,892,792 B2 | 2/2018 | Kim | |
| 10,229,744 B2 | 3/2019 | Dutta et al. | |
| 10,490,244 B2 | 11/2019 | Oh | |
| 10,607,688 B2 | 3/2020 | Shin et al. | |
| 2007/0036001 A1 | 2/2007 | Kanda et al. | |
| 2008/0279012 A1 | 11/2008 | Lee | |
| 2009/0055577 A1 | 2/2009 | Moon et al. | |
| 2009/0257281 A1 | 10/2009 | Lee | |
| 2013/0242675 A1 | 9/2013 | Kwak et al. | |
| 2019/0005995 A1 | 1/2019 | Oh | |
| 2019/0147955 A1 | 5/2019 | Chen et al. | |
| 2020/0143890 A1 | 5/2020 | Lee | |

OTHER PUBLICATIONS

Partial European Search Report dated Nov. 29, 2021 issued in corresponding European Patent Application No. 21178135.6.

* cited by examiner

FIG. 21A

T2B(ST3 PROGRAM)

| STRING | | PBLS | PBST1 | PBST2 | PGME | PGMRC1 | PGMRC2 |
|---|---|---|---|---|---|---|---|
| | BL | \multicolumn{4}{c|}{VINH OR VPER} | | VPER | |
| | SSL–SST | VSOFF | VSOFF | VSON | VSON | VSOFF | VSOFF |
| ST3 | MC12 | Vo | Vo | VPASS2 | VPASS2 | VNEG | Vo |
| | MC11 | Vo | Vo | VPASS2 | VPGM | VNEG | Vo |
| | MC10 | Vo | Vo | VPASS2 | VPASS2 | VNEG | Vo |
| | MC9 | | | | | | |
| BNDU | USL–MC8 | VUON | VUON | VUOFF | VUOFF | VUON | VUOFF |
| ST2 | MC7 | Vo | VPASS1 | VPASS1 | VPASS1 | VPASS1 | Vo |
| | MC6 | | | | | | |
| | MC5 | | | | | | |
| BNDL | LSL–MC4 | VLON | VLON | VLOFF | VLOFF | VLON | VLOFF |
| ST1 | MC3 | Vo | VPASS1 | VPASS1 | VPASS1 | VPASS1 | Vo |
| | MC2 | | | | | | |
| | MC1 | | | | | | |
| | GSL–GST | VGON | VGOFF | VGOFF | VGOFF | VGOFF | VGOFF |
| | CSL | \multicolumn{3}{c|}{VPC} | VPC | VSS | VSS |

FIG. 21B

T2B(ST2 PROGRAM)

| STRING | | PBLS | PBST1 | PBST2 | PGME | PGMRC1 | PGMRC2 |
|---|---|---|---|---|---|---|---|
| | BL | \multicolumn{4}{c}{VINH OR VPER} | | VPER | |
| | SSL—SST | VSOFF | VSOFF | VSON | VSON | VSOFF | VSOFF |
| ST3 | MC12, MC11, MC10, MC9 | Vo | Vo | VPASS2 | VPASS2 | VPASS2 | Vo |
| BNDU | USL—MC8 | VUON | VUON | VUOFF | VUON | VUOFF | VUOFF |
| ST2 | MC7 | Vo | Vo | VPASS2 | VPASS2 | VNEG | Vo |
| | WL_SEL—MC6 | Vo | Vo | VPASS2 | VPGM | VNEG | Vo |
| | MC5 | Vo | Vo | VPASS2 | VPASS2 | VNEG | Vo |
| BNDL | LSL—MC4 | VLON | VLON | VLOFF | VLOFF | VLON | VLOFF |
| ST1 | MC3, MC2, MC1 | Vo | VPASS1 | VPASS1 | VPASS1 | VPASS1 | Vo |
| | GSL—GST | VGON | VGOFF | VGOFF | VGOFF | VGOFF | VGOFF |
| | CSL | VPC | VPC | VPC | VPC | VSS | VSS |

NONVOLATILE MEMORY DEVICE AND METHOD OF PROGRAMMING IN A NONVOLATILE MEMORY

CROSS-REFERENCE TO RELATED APPLICATION

This US application claims priority under 35 USC § 119 to Korean Patent Application No. 10-2020-0139081, filed on Oct. 26, 2020, in the Korean Intellectual Property Office (KIPO), the disclosure of which is incorporated in its entirety by reference herein.

BACKGROUND

Example embodiments generally relate to semiconductor memory devices, and more particularly to a nonvolatile memory device and/or a method of programming in a nonvolatile memory device.

Semiconductor memory devices for storing data may be classified into volatile memory devices and nonvolatile memory devices. Volatile memory devices, such as dynamic random access memory (DRAM) devices, are typically configured to store data by charging or discharging capacitors in memory cells, and may lose the stored data when power is off/disabled. Nonvolatile memory devices, such as flash memory devices, may maintain stored data even though power is off. Volatile memory devices are widely used as main memories of various apparatuses, while nonvolatile memory devices are widely used for storing program codes and/or data in various electronic devices, such as computers, mobile devices, etc.

Recently, nonvolatile memory devices of three-dimensional structure such as a vertical NAND memory devices have been developed to increase integration degree and memory capacity of the nonvolatile memory devices. Along with increase in the integration degree and/or memory capacity, disturbance of unselected memory cells may increase during programming of selected memory cells.

SUMMARY

Some example embodiments may provide a nonvolatile memory device capable of enhancing efficiency of a programming operation.

Alternatively or additionally, some example embodiments may provide a method of programming in a nonvolatile memory device, capable of enhancing efficiency of a programming operation.

According to some example embodiments, a nonvolatile memory device includes at least one memory block including a plurality of cell strings, each of the plurality of cell strings including a string selection transistor, a plurality of memory cells, and a ground selection transistor, the string selection transistor, the plurality of memory cells, and the ground selection transistors between a source line and a bit-line and connected in series in a vertical direction, and a control circuitry configured to control a program operation by precharging channels of the plurality of cell strings to a first voltage during a bit-line set-up period of a program loop, applying a program voltage to a selected word-line of the plurality of cell strings during a program execution period of the program loop, and after recovering voltages of the selected word-line and of unselected word-lines of the plurality of cell strings to a voltage less than a ground voltage, recovering the voltages of the selected word-line and of the unselected word-lines to a second voltage greater than the ground voltage during a recovery period of the program loop.

According to some example embodiments, there is provided a method of programming a memory device which includes at least one memory block including a plurality of cell strings, each of the plurality of cell strings including a string selection transistor, a plurality of memory cells, and a ground selection transistor, the string selection transistor, the plurality of memory cells, and the ground selection transistor connected in series in a vertical direction between a source line and a bit-line. The method includes precharging channels of the plurality of cell strings to a first voltage during a bit-line set-up period of a program loop, applying a program voltage to a selected word-line of the plurality of cell strings during a program execution period of the program loop, and recovering voltages of unselected word-lines of the plurality of cell strings to a second voltage greater than a ground voltage after lowering voltages of the selected word-line and the unselected word-line to a voltage less than the ground voltage during a recovery period of the program loop.

According to some example embodiments, there is provided a method of programming a memory device which includes at least one memory block including a plurality of cell strings, each of the plurality of cell strings including a string selection transistor, a plurality of memory cells, and a ground selection transistor, the string selection transistor, the plurality of memory cells, and the ground selection transistor connected in series in a vertical direction between a source line and a bit-line. The method includes applying a second voltage to a selected word-line of the plurality of cell strings to precharge channels of the plurality of cell strings to a first voltage during a bit-line set-up period of each of a plurality of program loops, applying the second voltage to unselected word-lines of the plurality of cell strings during a bit-line set-up period of a first program loop from among the plurality of program loops, applying a negative voltage, which decreases in a step-wise manner as a number of the program loops increases, to the unselected word-lines of the plurality of cell strings during a bit-line set-up period of each of the plurality of program loops except the first program loop, and applying a program voltage, which increases in a step-wise manner as the number of the program loops increases, to the selected word-line of the plurality of cell strings while applying a program pass voltage having a fixed levels to the unselected word-lines of the plurality of cell strings during a program execution period of each of the plurality of program loops.

Accordingly, since voltages of the selected word-line and the unselected word-lines are recovered after lowering the voltages of the selected word-line and the unselected word-lines to a negative level during the program recovery period, the soft erase phenomenon which may occur in memory cells of the unselected cell string and/or the HCI which may occur in memory cells in the selected cell string may be prevented or reduced in likelihood of occurrence. Alternatively or additionally, boosting efficiency may be enhanced and the pass disturbance may be reduced and by decreasing step-wisely a level of a negative voltage applied to unselected word-line during a bit-line setup period and maintaining a level of a program pass voltage applied to the unselected word-line during a program execution period.

BRIEF DESCRIPTION OF THE DRAWINGS

Illustrative, non-limiting example embodiments will be more clearly understood from the following detailed description in conjunction with the accompanying drawings.

FIGS. 21A and 21B are diagrams illustrating a program operation with respect to stacks of the memory cell array of FIG. 20 according to the first program scenario of FIG. 17.

DETAILED DESCRIPTION OF SOME EXAMPLE EMBODIMENTS

Various example embodiments will be described more fully hereinafter with reference to the accompanying drawings, in which some example embodiments are shown.

Figure 1:
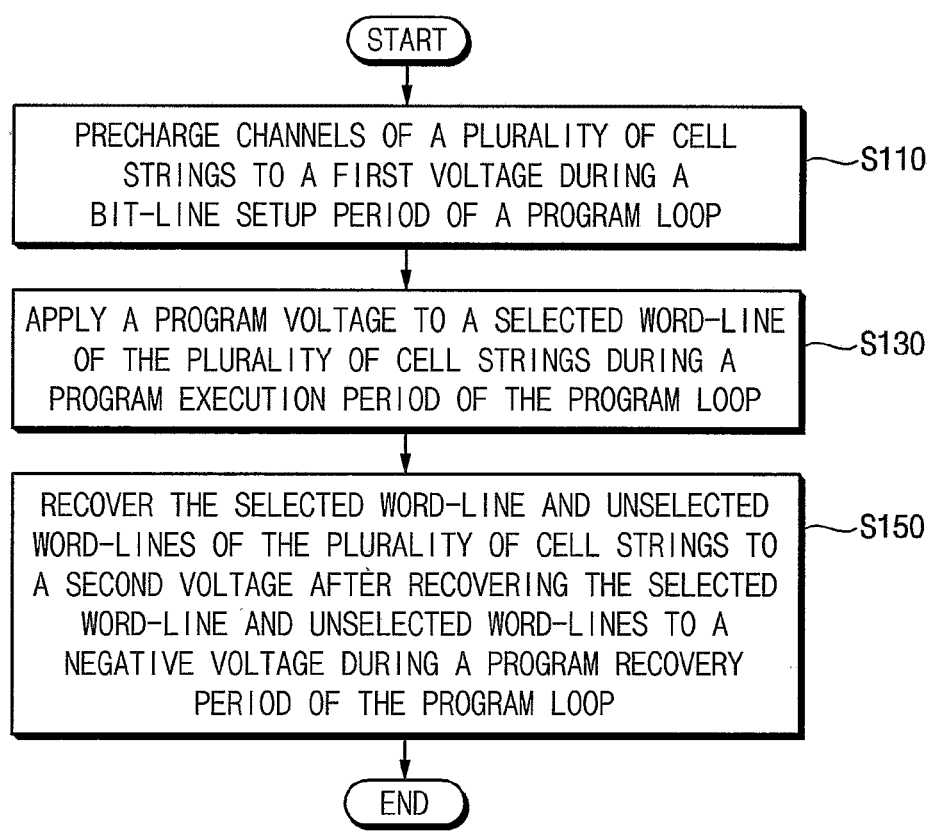
FIG. 1 is a flow chart illustrating a method of programming in a nonvolatile memory device according to some example embodiments.

FIG. 1 is a flow chart illustrating a method of programming in a nonvolatile memory device according to some example embodiments.

FIG. 1 illustrates a method of programming in a nonvolatile memory device including at least one memory block which includes a plurality of cell strings, where each cell string includes a string selection transistor, a plurality of memory cells and a ground selection transistor connected between a bit line and a source line. According to some example embodiments, the nonvolatile memory device may include a three-dimensional NAND flash memory device and/or a vertical NAND flash memory device.

Referring to FIG. 1, channels of a plurality of cell strings are precharged to a first voltage during a bit-line set-up period of a program loop (operation S110). In general, the channels of the cell strings may be precharged through string selection transistors by a setup voltage of a bit line during a bit-line set-up period. However, in cases of programming the memory cells earlier as the memory cells are located at an upper position for reducing program disturbance, the channels cannot be precharged and/or initialized through the string selection transistors if any memory cell above (e.g. further from the substrate) the selected memory cell has been programmed from an erased state to a programmed state. Accordingly, the channels of the cell strings may be precharged through the ground selection transistors when the memory cells are programmed earlier as the memory cells are located at an upper position, e.g. further from a surface of the substrate).

The three-dimensional NAND flash memory device is more vulnerable to the program disturbance as the size and/or the critical dimension (CD)/diameter of the channel hole is smaller. In example embodiments of a multiple level cell (MLC), the bit number programmed in each cell may be increased; e.g. an MLC may store more than a single bit of data. The number of the program loops may be increased due to the increased number of the programmed states and thus the performance degradation due to the program disturbance is increased. Accordingly the program operation may be performed along the direction of a size decrease of the channel hole, e.g. of a tapering of the channel, as will be described below. When the program operation is performed along the direction of the size decrease of the channel hole, e.g. of a tapering of the channel, a bias voltage may be applied to a ground selection line and an unselect string initial precharge (USIP) may be performed using a voltage of a source line.

A program voltage is applied to a selected word-line of the plurality of cell strings during a program execution period of the program loop (operation S130). In some example embodiments, a program pass voltage may be applied to unselected word-lines of the plurality of cell strings during the program execution period.

After recovering voltages of the selected word-line and unselected word-lines of the plurality of cell strings to a voltage smaller than a ground voltage, e.g. to a negative voltage, the voltages of the selected word-lines and the unselected word-lines recover to a second voltage greater than the ground voltage during a recovery period of the program loop (operation S150). When the voltages of the selected word-lines and the unselected word-lines recover to the second voltage after recovering the voltages of the selected word-line and the unselected word-lines, the voltages of the selected word-line and the unselected word-lines may be stably or more stably recovered to a voltage before being precharged during a verification read period successive to the program recovery period. In some example embodiments, soft erase and/or hot carrier injection which may occur in the unselected word-lines may be prevented or reduced in likelihood of occurrence.

Figure 2:
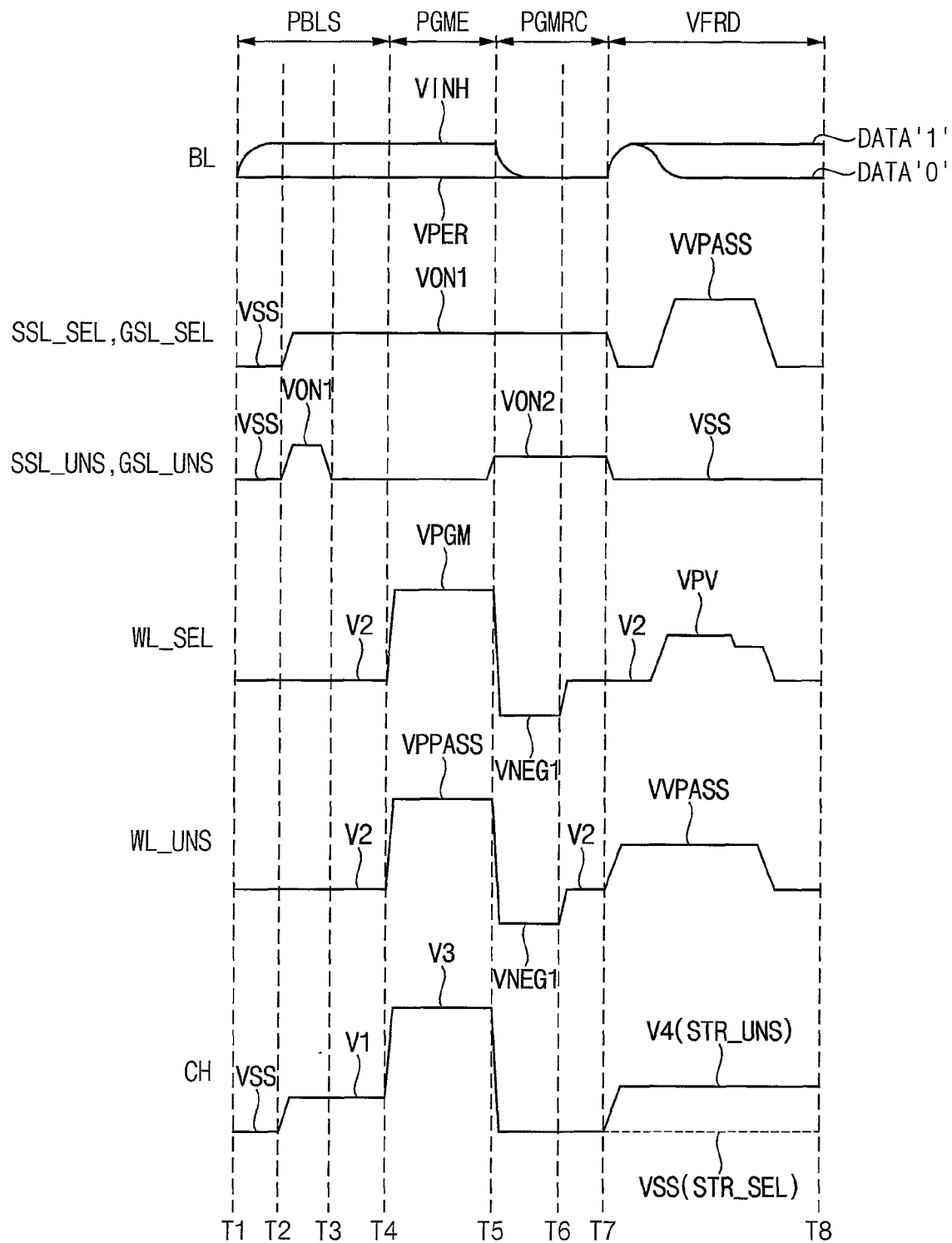
FIG. 2 is a timing diagram illustrating a method of programming in a nonvolatile memory device according to some example embodiments.

FIG. 2 is a timing diagram illustrating a method of programming in a nonvolatile memory device according to some example embodiments.

FIG. 2 is a timing diagram illustrating a bit-line set-up period PBLS, a program execution period PGME, a program recovery period PGMRC, and a verification read period VFRD of one of a plurality of program loops. Time points T1~T8 represent/correspond to boundaries of the periods.

Referring to FIG. 2, during the bit-line set-up period PBLS, a ground voltage VSS, e.g. 0 volts, is applied to a string selection line SSL_SEL and a ground selection line GSL_SEL of a selected cell string from the time point T1 to the time point T2 and a first turn-on voltage VON1 (e.g. a positive voltage) is applied to the string selection line SSL_SEL and the ground selection line GSL_SEL of the selected string from the time point T2 to the time point T4. The ground voltage VSS is applied to a string selection line SSL_UNS and a ground selection line GSL_UNS of an unselected cell string from the time point T1 to the time point T2, the first turn-on voltage VON1 is applied to the string selection line SSL_UNS and the ground selection line GSL_UNS of the unselected cell string from the time point T2 to the time point T3, and the ground voltage VSS is applied to the string selection line SSL_UNS and the ground selection line GSL_UNS of the unselected cell string from the time point T3 to the time point T4. In some example embodiments, levels of voltages applied to the string selection line SSL_UNS and the ground selection line GSL_UNS of the unselected cell string may be varied according to a position of, e.g. a position relative to the row and/or column of, the unselected cell string.

A second voltage V2 greater than the ground voltage VSS is applied to a selected word-line WL_SEL and to an unselected word-line WL_ULS from the time point T1 to the time point T4. Accordingly, a channel of each of the cell strings is precharged from the ground voltage VSS to the first voltage V1. For example, a channel of each of the cell strings is precharged to the first voltage V1 by performing an unselect string initial precharge (USIP).

The USIP may be performed by using a gate induced drain leakage (GIDL) phenomenon. In more detail, GIDL indicates a phenomenon of leakage occurring at a drain of a transistor that is induced by/caused by a gate of the transistor. For example, when 0V or a negative voltage level is applied to the gate and a sufficiently high positive voltage is applied to the drain, severe band bending may be induced in the (gate) oxide near the drain, and thus band-to-band tunneling from the valence band of the silicon surface to the conduction band of the silicon body may occur.

The tunneling elections are attracted to the drain, and the drain current increases. Usually the semiconductor substrate is biased by a ground voltage, and holes are attracted to the semiconductor substrate of a relatively low voltage. The gate voltage of a negative voltage level is used to turn off the transistor (for example, for NMOS transistors), but the transistor operates as if it is turned on because the drain current of the GIDL current increases due to the GIDL phenomenon. The GIDL current increases as the gate voltage is decreased and/or the drain voltage is increased.

The channels of each of the cell strings may be precharged by using the GIDL phenomenon. For generating the GIDL phenomenon, at least one of a string selection transistor of a cell string, a ground selection transistor of a cell string, or a GIDL transistor may be used, which will be described with reference to FIGS. 6A through 6D.

A program inhibit voltage VINH or a program permission voltage VPER is applied to a bit-line BL based on a value of write data at a starting point T1 of the bit-line set-up period PBLS.

During the program execution period PGME between the time point T4 and the time point T5, successive to the bit-line set-up period PBLS, the first turn-on voltage VON1 is applied to string selection line SSL_SEL and the ground selection line GSL_SEL of the selected string, a program voltage VPGM is applied to the selected word-line WL_SEL, and a program pass voltage VPPASS is applied to the unselected word-line WL_UNS. Accordingly, voltage level of the channel CH of each of the cell strings is increased to a third voltage V3. During the program execution period PGME, the level of the bit-line BL is maintained at the program inhibit voltage VINH or the program permission voltage VPER based on the value of the write data.

During the program recovery period PGMRC between the time point T5 and the time point T7, successive to the program execution period PGME, the first turn-on voltage VON1 is applied to the string selection line SSL_SEL and the ground selection line GSL_SEL of the selected string, a second turn-on voltage VON2 less than the first turn-on voltage VON1 is applied to the string selection line SSL_UNS and to the ground selection line GSL_UNS of the unselected cell string. Accordingly, voltage level of the channel CH of each of the cell strings is increased to a third voltage V3. Alternatively or additionally, after a first negative voltage VNEG1 is applied to the selected word-line WL_SEL and the unselected word-line WL_UNS from the time point T5 and to the time point T6, the second voltage V2 is applied to the selected word-line WL_SEL and the unselected word-line WL_UNS from the time point T6 and to the time point T7. The selected word-line WL_SEL and the unselected word-line WL_UNS are recovered to the second voltage V2 after the selected word-line WL_SEL and the unselected word-line WL_UNS are recovered to the first negative voltage VNEG1. Since the first turn-on voltage VON1 is applied to the string selection line SSL_SEL and the ground selection line GSL_SEL of the selected string, and the second turn-on voltage VON2 is applied to string selection line SSL_UNS and the ground selection line GSL_UNS of the unselected cell string, the selected cell string and the unselected cell string are open/electrically open, and thus the voltage level of the channel CH of each of the cell strings is lowered to a voltage level around the ground voltage VSS, and the voltage level is maintained. The voltage level of the bit-line BL converges to the program permission voltage VPER during the program recovery period PGMRC.

During the verification read period VFRD between the time point T7 and the time point T8, successive to the recovery period PGMRC, a verification pass voltage VVPASS is applied to string selection line SSL_SEL and to the ground selection line GSL_SEL of the selected string, and the ground voltage VSS is applied to the string selection line SSL_UNS and the ground selection line GSL_UNS of the unselected cell string. In addition, a verification read voltage VPV is applied to the selected word-line WL_SEL and the verification pass voltage VVPASS is applied to the unselected word-line WL_UNS. Therefore, a voltage level of the channel of the selected cell string STR_SEL is maintained at a voltage level around the ground voltage VSS, and a voltage level of the channel of the unselected cell string STR_UNS is increased to a fourth voltage V4. The fourth voltage V4 may be less than the third voltage V3 and may be greater than the first voltage V1. Therefore, the soft erase phenomenon/error which may occur in the unselected cell string STR_UNS, and/or the hot carrier injection (HCI) phenomenon which may occur at an edge of the selected cell string STR_SEL may be prevented or reduced in likelihood of occurrence.

Contrariwise, assuming that a voltage level (e.g., a potential) of the channel, which is not lowered during the program recovery period PGMRC, has a first level corresponding to a precharged voltage. During the verification read period VFRD, when the verification read voltage VPV is applied to the selected word-line WL_SEL and the verification pass voltage VVPASS is applied to the unselected word-line WL_UNS, a voltage level of the unselected cell string has a high level corresponding to the first level and the level of the verification pass voltage. Accordingly, the soft erase error may occur in memory cells of the unselected cell string due to high voltage level of the channel of the unselected cell string. Alternatively or additionally, since a voltage level of the channel of the selected cell string rapidly changes from the first level to the level of the ground voltage VSS, leakage current may be HCI-injected to a string selection transistor and/or a ground selection transistor of the selected cell string due to rapid change of the channel. Accordingly a threshold voltage of the string selection transistor or the ground selection transistor may increase. For example, electrons may become trapped in a gate of either or both of the string selection transistor or the ground selection transistor, affecting the respective threshold voltage.

Even though not illustrated in FIG. 2, during a bit-line precharge period before the verification read period VFRD, all of the bit-lines may be initialized by the same bit-line precharge voltage. A voltage of a bit-line is developed to a voltage corresponding to '1' or alternatively to '0' depending on the threshold voltage state of the selected memory cell during the verification read period VFRD. The data stored in the selected memory cell may be determined by sensing the voltage development of the bit-line.

Figure 3:
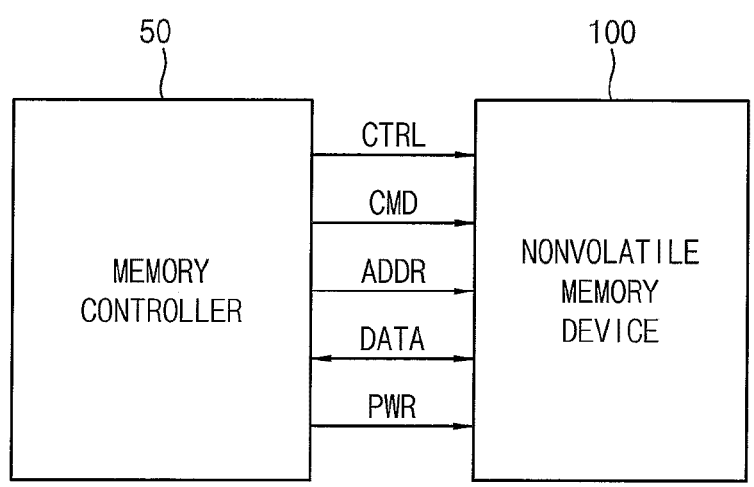
FIG. 3 is a block diagram illustrating a memory system (e.g., a storage device) the according to some example embodiments.

FIG. 3 is a block diagram illustrating a memory system (e.g., a storage device) the according to some example embodiments.

Referring to FIG. 3, a storage device (e.g., a memory system) 10 may include a memory controller 50 and at least one nonvolatile memory device 100.

In some example embodiments, each of the memory controller 50 and the nonvolatile memory device 100 may be provided with the form of a chip, a package, or a module. Alternatively or additionally, the memory controller 50 and the nonvolatile memory device 100 may be packaged into one of various packages.

The nonvolatile memory device 100 may perform any or all of an erase operation, a program operation, or a write operation under control of the memory controller 50. The nonvolatile memory device 100 receives a command CMD, an address ADDR and data DATA through input/output lines from the memory controller 50 for performing such operations. Alternatively or additionally, the nonvolatile memory device 100 receives a control signal CTRL through a control line from the memory controller 50. Alternatively or additionally, the nonvolatile memory device 100 receives a power PWR through a power line from the memory controller 50.

Figure 4:
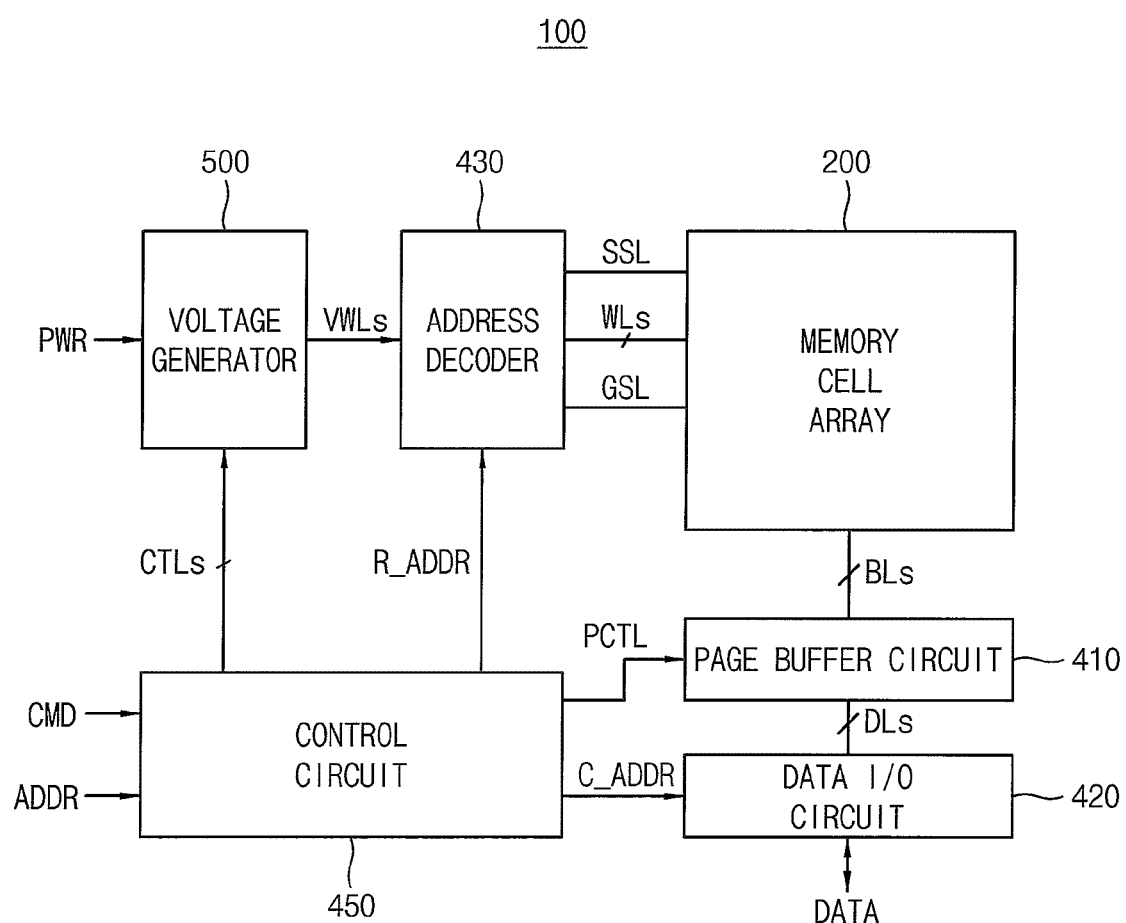
FIG. 4 is a block diagram illustrating the nonvolatile memory device in the memory system of FIG. 3 according to some example embodiments.

FIG. 4 is a block diagram illustrating the nonvolatile memory device in the memory system of FIG. 3 according to some example embodiments.

Referring to FIG. 4, the nonvolatile memory device 100 includes a memory cell array 200, an address decoder 430, a page buffer circuit 410, a data input/output (I/O) circuit 420, a cell counter 490, a control circuit 450, and a voltage generator 500.

The memory cell array 200 may be coupled to the address decoder 430 through a string selection line SSL, a plurality of word-lines WLs, and a ground selection line GSL. In addition, the memory cell array 200 may be coupled to the page buffer circuit 410 through a plurality of bit-lines BLs. The memory cell array 200 may include a plurality of memory cells coupled to the plurality of word-lines WLs and the plurality of bit-lines BLs.

In some example embodiments, the memory cell array 200 may be or may include a three-dimensional memory cell array, which is formed on a substrate in a three-dimensional structure (or a vertical structure). In some example embodiments, the memory cell array 200 may include vertical cell strings that are vertically oriented such that at least one memory cell is located over or above another memory cell.

The control circuit 450 may receive a command (signal) CMD and an address (signal) ADDR from the memory controller 100, and may control at least one of an erase loop, a program loop and a read operation of the nonvolatile memory device 200 based on the command signal CMD and the address signal ADDR. The program loop may include a program operation and a program verification operation. The erase loop may include an erase operation and an erase verification operation.

For example, the control circuit 450 may generate control signals CTLs to control the voltage generator 500, and may generate a page buffer control signal PCTL to control the page buffer circuit 410 based on the command signal CMD. The control circuit 450 may generate a row address R_ADDR and a column address C_ADDR based on the address signal ADDR. The control circuit 450 may provide the row address R_ADDR to the address decoder 430, and may provide the column address C_ADDR to the data input/output circuit 420.

The address decoder 430 may be coupled to the memory cell array 200 through the string selection line SSL, the plurality of word-lines WLs, and the ground selection line GSL. During the program operation or the read operation, the address decoder 430 may determine one of the plurality of word-lines WLs as a selected word-line and may determine the rest of the plurality of word-lines WLs except for the selected word-line as unselected word-lines based on the row address R_ADDR.

The voltage generator 500 may generate word-line voltages VWLs, which are required for/used for the operation of the nonvolatile memory device 200, based on the control signals CTLs. The voltage generator 500 may receive the power PWR from the memory controller 100. The word-line voltages VWLs may be applied to the plurality of word-lines WLs through the address decoder 430.

For example, during the erase operation, the voltage generator 500 may apply an erase voltage to a well (e.g. an NWELL and/or a PWELL) of the memory block and may apply a ground voltage to the entire word-lines of the memory block. During the erase verification operation, the voltage generator 500 may apply an erase verification voltage to the entire word-lines of the memory block, and/or sequentially apply the erase verification voltage to word-lines in a word-line basis.

For example, during the program operation, the voltage generator 500 may apply a program voltage to the selected word-line and may apply a program pass voltage to the unselected word-lines. In addition, during the program verification operation, the voltage generator 500 may apply a program verification voltage to the selected word-line and may apply a verification pass voltage to the unselected word-lines.

The page buffer circuit 410 may be coupled to the memory cell array 200 through the plurality of bit-lines BLs. The page buffer circuit 410 may include a plurality of page buffers. The page buffer circuit 410 may store, e.g. temporarily store data to be programmed in a selected page or data read out from the selected page.

The data input/output circuit 420 may be coupled to the page buffer circuit 410. During the program operation, the data input/output circuit 420 may receive program data DATA from the memory controller 100 and may provide the program data DATA to the page buffer circuit 410 based on the column address C_ADDR received from the control circuit 450. During the read operation, the data input/output circuit 420 may provide read data DATA, which are stored in the page buffer circuit 410, to the memory controller 100 based on the column address C_ADDR received from the control circuit 450. Although not illustrated in FIG. 4, there may be additional arrays such as redundancy arrays separate from or included in the memory cell array 200.

Figure 5:
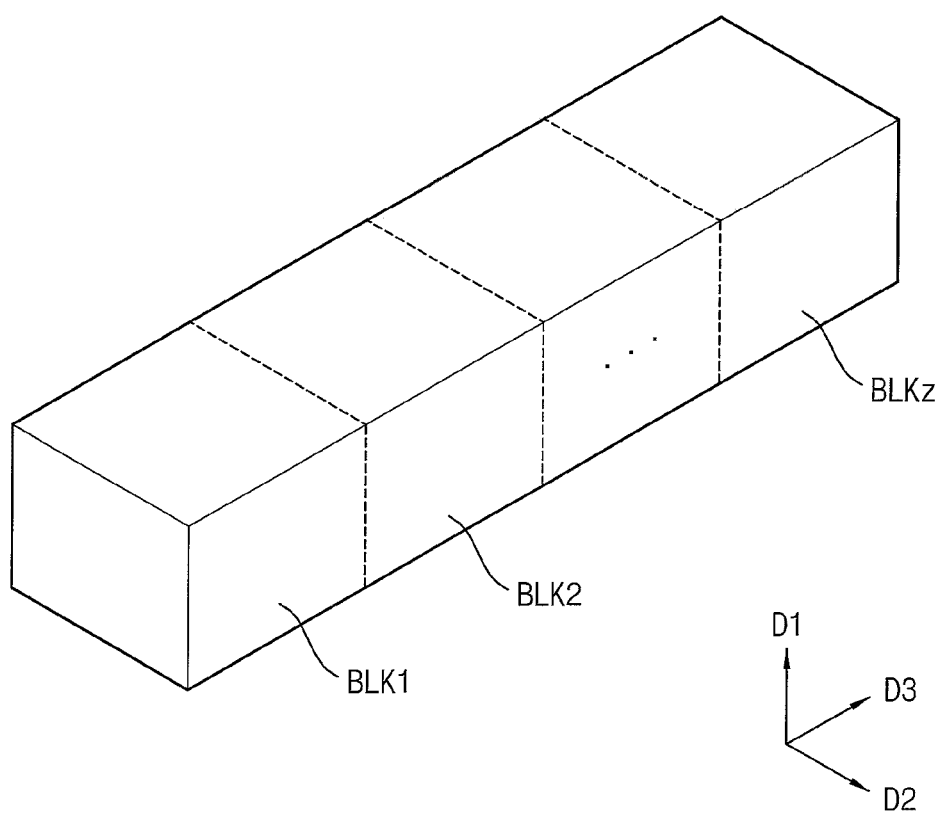
FIG. 5 is a block diagram illustrating an example of the memory cell array in FIG. 4 according to some example embodiments.

FIG. 5 is a block diagram illustrating an example of the memory cell array in FIG. 4 according to some example embodiments.

Referring to FIG. 5, the memory cell array 200 may include a plurality of memory blocks BLK1 to BLKz which extend along first through third directions D1, D2 and D3. In some example embodiments, the memory blocks BLK1 to BLKz are selected by the address decoder 430 in FIG. 4. For example, the address decoder 430 may select a memory block BLK corresponding to a block address among the memory blocks BLK1 to BLKz.

Hereinafter, the first direction D1 indicates a direction perpendicular to an upper surface of a semiconductor substrate (e.g. a Z direction), and the second direction D2 and the third direction D3 indicate two directions parallel to the upper surface of the semiconductor substrate (e.g. an X direction and a Y direction). For example, the second direction and the third direction D3 may be perpendicular to each other. The first direction D1 may be referred to as a vertical direction, the second direction D2 may be referred to as a row direction and the third direction D3 may be referred to as a column direction. The direction indicated by an arrow in figures and the opposite direction may be considered as the same direction.

Figure 6A:
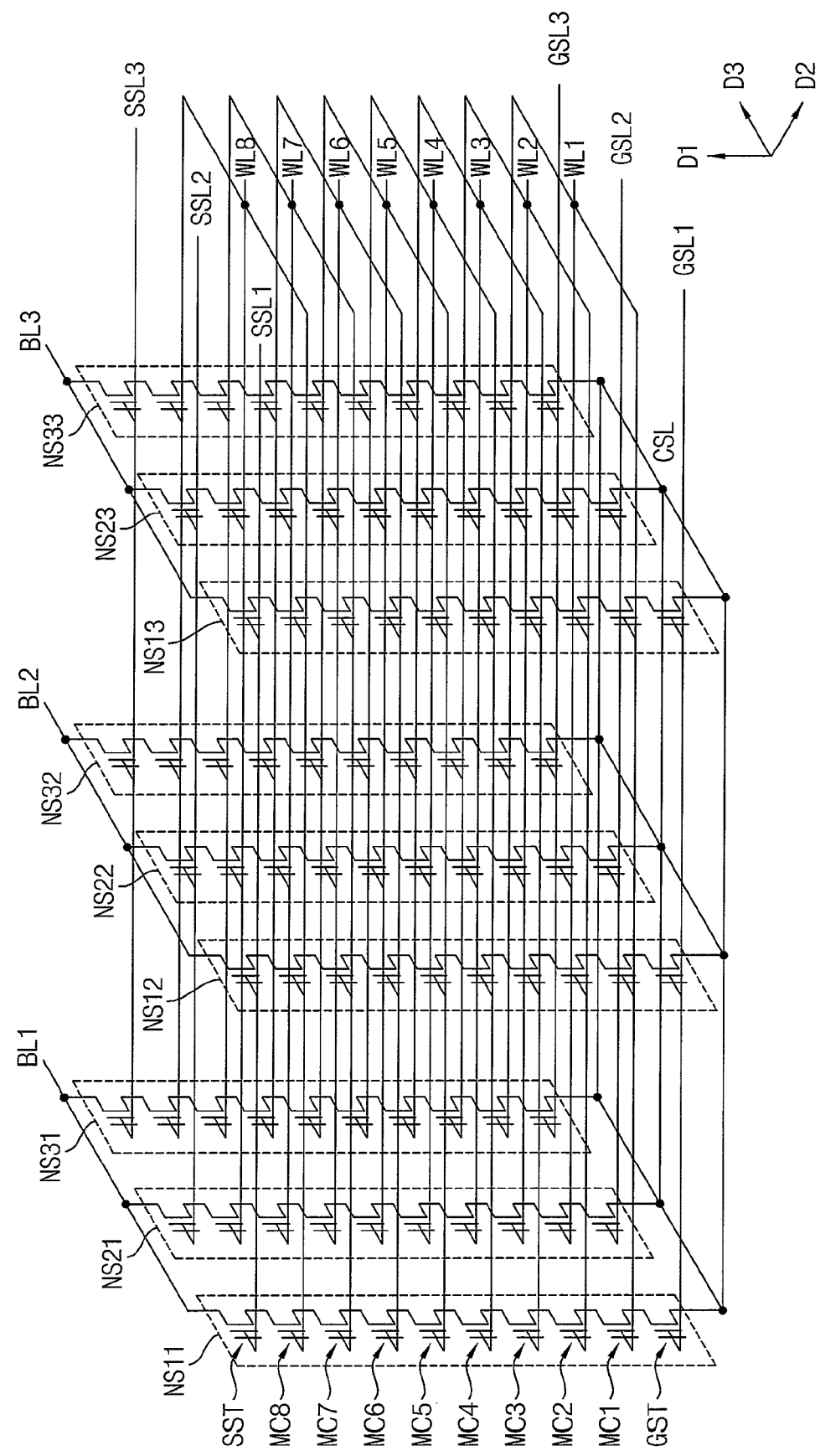
FIG. 6A is a circuit diagram illustrating one of the memory blocks in FIG. 5 according to some example embodiments.

FIG. 6A is a circuit diagram illustrating one of the memory blocks in FIG. 5 according to some example embodiments.

The memory block BLKi of FIG. 6A may be formed on a substrate in a three-dimensional structure (e.g. a vertical structure). For example, a plurality of memory cell strings included in the memory block BLKi may be formed in a direction perpendicular to the substrate.

Referring to FIG. 6A, the memory block BLKi may include memory cell strings NS11 to NS33 coupled between bit-lines BL1, BL2 and BL3 and a common source line CSL.

Each of the memory cell strings NS11 to NS33 may include a string selection transistor SST, a plurality of memory cells MC1 to MC8, and a ground selection transistor GST. In FIG. 6A, each of the memory cell strings NS11 to NS33 is illustrated to include eight memory cells MC1 to MC8. However, example embodiments are not limited thereto. In some example embodiments, each of the memory cell strings NS11 to NS33 may include any number of memory cells, which may or may not be a power of two. Furthermore each of the transistors SST, the plurality of memory cells MC1 to MC8, and the ground selection transistors GST are illustrated as being NMOS transistors; however, example embodiments are not limited thereto, and any or all of the transistors may be PMOS transistors. Furthermore the electrical characteristics such as the threshold voltages and/or the drive currents of transistors such as the string selection transistors SST may be the same as, or different from, the electrical characteristics of other transistors such as the ground selection transistors GST, and may or may not be floating gate transistors.

The string selection transistor SST may be connected to corresponding string selection lines SSL1 to SSL3. The plurality of memory cells MC1 to MC8 may be connected to corresponding word-lines WL1 to WL8, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL. Word-lines (e.g., WL1) at the same height, e.g. at the same position relative to a surface of the substrate, may be commonly connected, and the ground selection lines GSL1 to GSL3 and the string selection lines SSL1 to SSL3 may be separated/electrically separated.

Figure 6B:
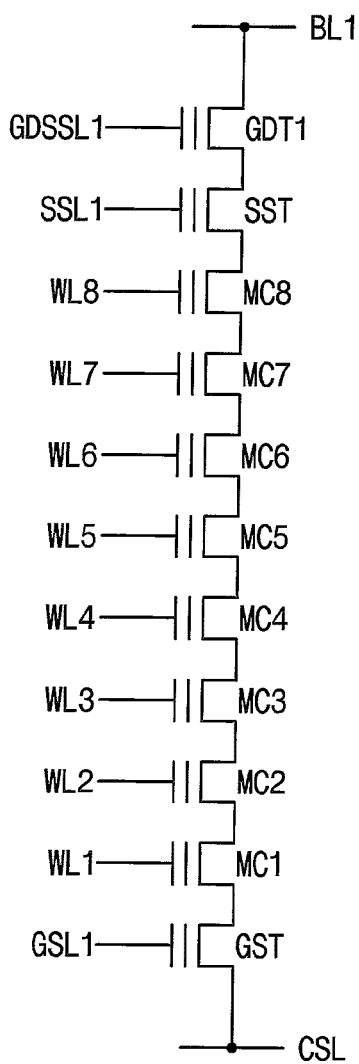
FIGS. 6B through 6D illustrate examples of one of cell strings in FIG. 6A, respectively, according to some example embodiments.
Figure 6C:
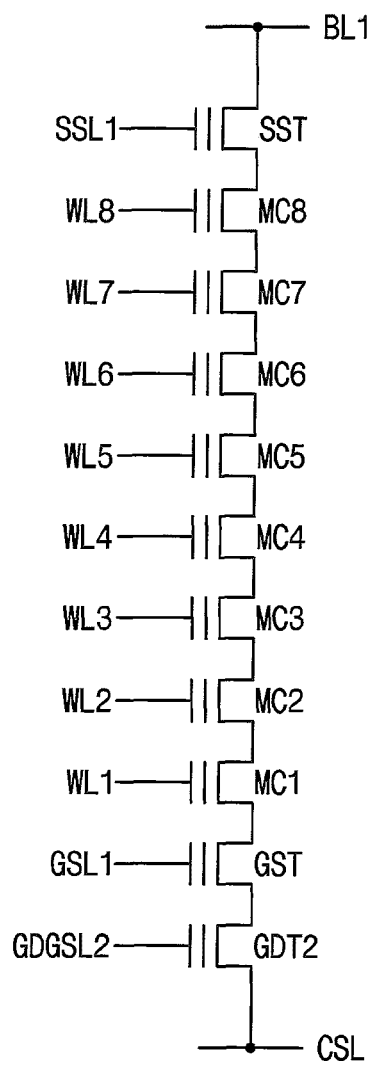
Figure 6D:
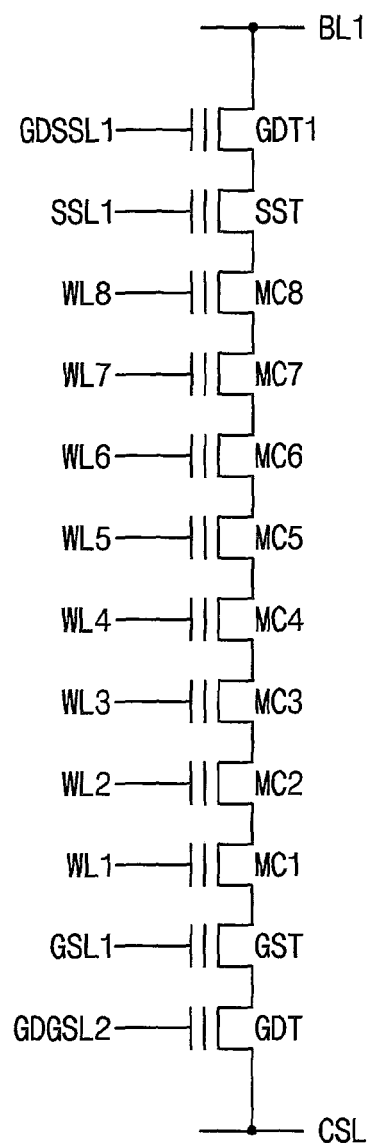

FIGS. 6B through 6D illustrate examples of one of cell strings in FIG. 6A, respectively, according to some example embodiments.

Referring to FIG. 6B, a cell string NS11a may include a ground selection transistor GST, a plurality of memory cells MC1 to MC8, a string selection transistor SST and a GIDL string selection transistor GDT1 connected in series between the common source line CSL and the bit-line BL1.

The GIDL string selection transistor GDT1 may be coupled to a GIDL string selection line GDSSL1. In some example embodiments, a uni-directional channel precharge may be performed in each of the cell strings during the bit-line set-up period PBLS, by applying a GIDL drain voltage to all or at least one or more such as some of the plurality of bit-lines such that the GIDL drain voltage has a voltage level higher than a voltage difference between a GIDL threshold voltage and a GIDL-on voltage during the bit-line set-up period PBLS. The GIDL-on voltage correspond to a voltage having a level to turn-on the GIDL string selection transistor GDT1. Each of the memory cell strings NS11 to NS33 in FIG. 6A may employ the cell string NS11a of FIG. 6B.

Referring to FIG. 6C, a cell string NS11b may include a GIDL ground selection transistor GDT2, a ground selection transistor GST, a plurality of memory cells MC1 to MC8 and a string selection transistor SST connected in series between the common source line CSL and the bit-line BL1. The GIDL ground selection transistor GDT2 may be coupled to a GIDL ground selection line GDGSL2. In some example embodiments, a uni-directional channel precharge may be performed in each of the cell strings during the bit-line set-up period PBLS, by applying a GIDL drain voltage to the common source line CSL. Each of the memory cell strings NS11 to NS33 in FIG. 6A may employ the cell string NS11b of FIG. 6C.

Referring to FIG. 6D, a cell string NS11c may include a GIDL ground selection transistor GDT2, a ground selection transistor GST, a plurality of memory cells MC1 to MC8, a string selection transistor SST and a GIDL string selection transistor GDT1 connected in series between the common source line CSL and the bit-line BL1. The GIDL ground selection transistor GDT2 may be coupled to a GIDL ground selection line GDGSL2 and the GIDL string selection transistor GDT1 may be coupled to a GIDL string selection line GDSSL1. In some example embodiments, a bi-directional channel precharge may be performed in each of the cell strings during the bit-line set-up period PBLS, by applying the GIDL drain voltage to at least a portion of the plurality of bit-lines and applying the GIDL drain voltage to common the source line CSL. Each of the memory cell strings NS11 to NS33 in FIG. 6A may employ the cell string NS11c of FIG. 6D. Example embodiments are not limited to those illustrated in FIGS. 6A to 6D nor are the example embodiments necessarily meant to be mutually exclusive with one another.

Figure 7:
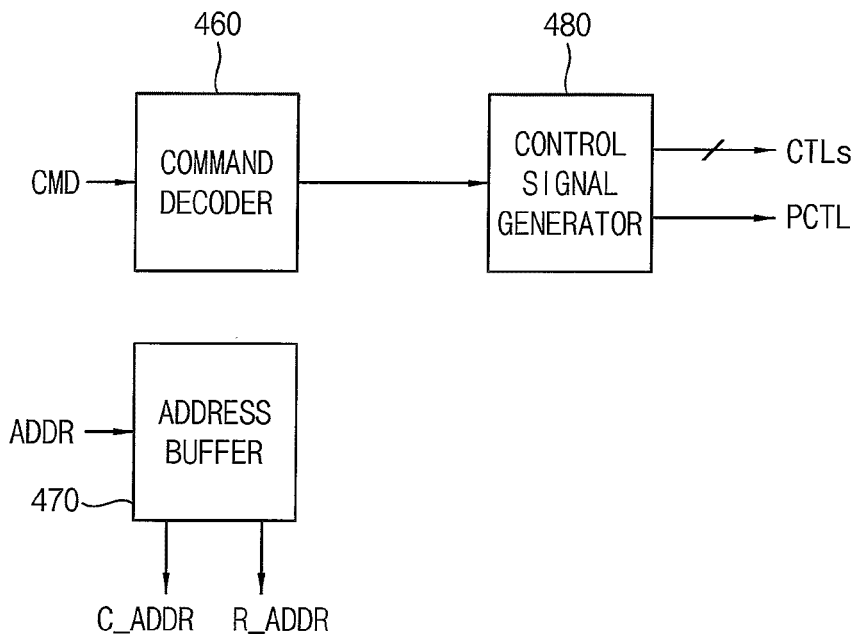
FIG. 7 is a block diagram illustrating the control circuit in the nonvolatile memory device of FIG. 4 according to some example embodiments.

FIG. 7 is a block diagram illustrating the control circuit in the nonvolatile memory device of FIG. 4 according to some example embodiments.

Referring to FIG. 7, the control circuit 450 includes a command decoder 460, an address buffer 470, and a control signal generator 480.

The command decoder 460 decodes the command CMD and provides a decoded command D_CMD to the control signal generator 480.

The address buffer 470 receives the address signal ADDR, provides the row address R_ADDR to the address decoder 430, and provides the column address C_ADDR to the data input/output circuit 420.

The control signal generator 480 receives the decoded command D_CMD, generates the control signals CTLs based on an operation directed by the decoded command D_CMD, provides the control signals CTLs to the voltage generator 500, generates a page buffer control signal PCTL, and provides the page buffer control signal PCTL to the page buffer circuit 410. Although each of the command decoder 460, the control signal generator 480, and the address buffer 470 are illustrated as being distinct, example embodiments are not limited thereto, and some of the functions of one of the command decoder 460, the control signal generator 480, and the address buffer 470 may be performed by others of the command decoder 460, the control signal generator 480, and the address buffer 470.

Figure 8:
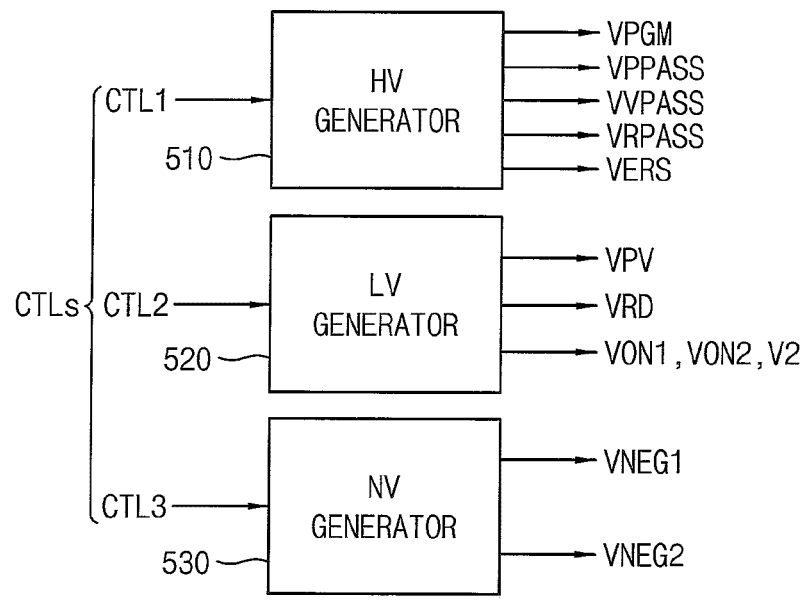
FIG. 8 is a block diagram illustrating the voltage generator in the nonvolatile memory device of FIG. 4 according to some example embodiments.

FIG. 8 is a block diagram illustrating the voltage generator in the nonvolatile memory device of FIG. 4 according to some example embodiments.

Referring to FIG. 8, the voltage generator 500 includes a high voltage generator 510 and a low voltage generator 520. The voltage generator 500 may further include a negative voltage generator 530.

The high voltage generator 510 may generate at least one of a program voltage PGM, a program pass voltage VPPASS, a verification pass voltage VVPASS, a read pass voltage VRPASS, and an erase voltage VERS according to operations directed by the command CMD, in response to a first control signal CTL1.

The program voltage PGM may be applied to the selected word-line. The program pass voltage VPPASS, the verification pass voltage VVPASS, and the read pass voltage VRPASS may be applied to the unselected word-lines. The erase voltage VERS may be applied to the well of the memory block. The first control signal CTL1 may include a plurality of bits which indicate the operations directed by the decoded command D_CMD.

The low voltage generator 520 may generate at least one of a program verification voltage VPV, an erase verification voltage VER, a read voltage VRD, a first turn-on voltage VON1, a second turn-on voltage VON2, and a second voltage V2 according to operations directed by the command CMD, in response to a second control signal CTL2. The program verification voltage VPV, the read voltage VRD, and the erase verification voltage VER may be applied to the selected word-line according to operation of the nonvolatile memory device 200. The first turn-on voltage VON1 and the second turn-on voltage VON2 may be applied to a string selection transistor and a ground selection transistor of each of the selected cell string and the unselected cell string. The second control signal CTL2 may include a plurality of bits which indicate the operations directed by the decode command D_CMD.

The negative voltage generator 750 may generate a first negative voltage VNEG1 and a second negative voltage VNEG2 which have negative levels, e.g. are lower than a ground voltage, according to operations directed by the command CMD, in response to a third control signal CTL3. The third control signal CTL3 may include a plurality of bits which indicate the operations directed by the decoded command D_CMD. The first negative voltage VNEG1 may be applied to a selected word-line and unselected word-lines during the program recovery period. The second negative voltage VNEG2 may be applied to the unselected word-lines during the bit-line set-up period. Although each of the high voltage generator 510, the low voltage generator 520, and the negative voltage generator 530 are illustrated as being distinct, example embodiments are not limited thereto, and one or more of the functions of one or more of the high voltage generator 510, the low voltage generator 520, and the negative voltage generator 530 may be performed by others of the high voltage generator 510, the low voltage generator 520, and the negative voltage generator 530.

Figure 9:
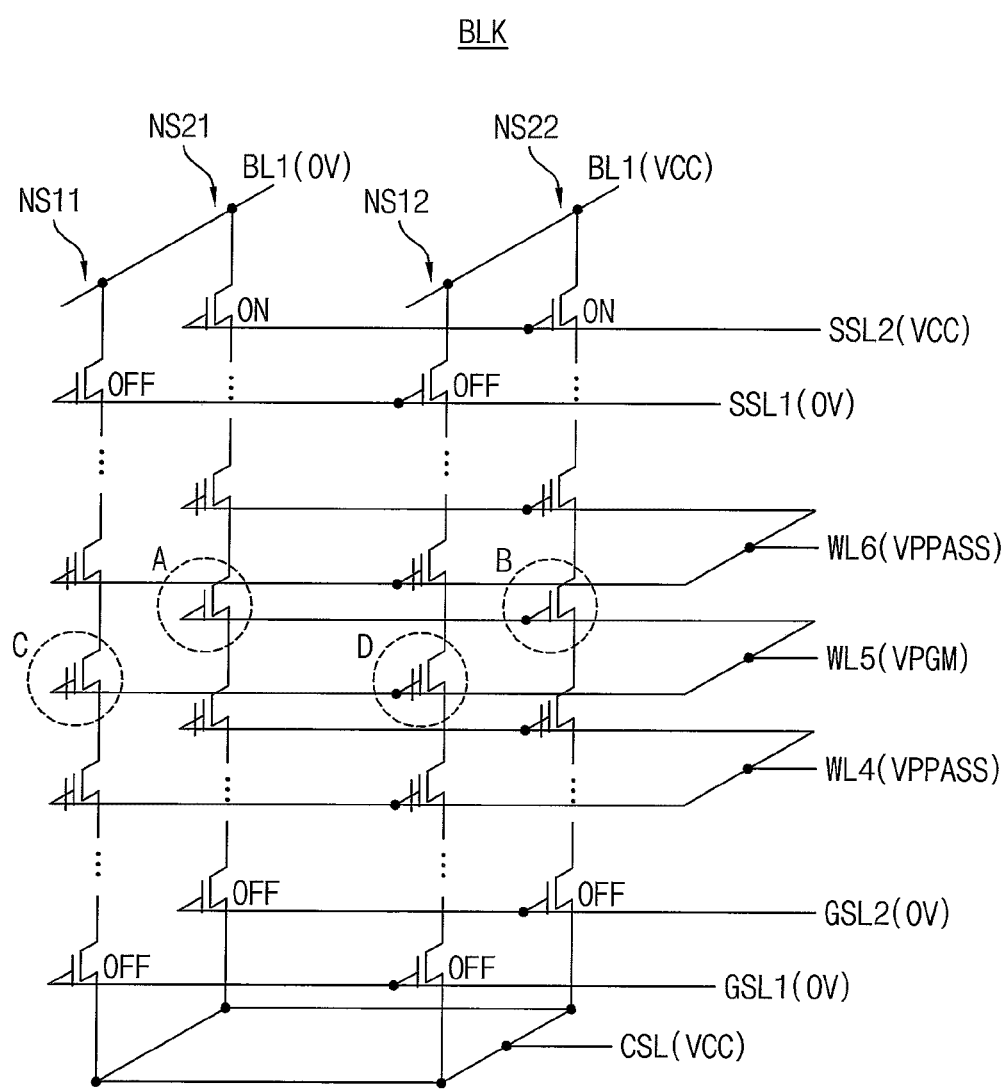
FIG. 9 is a circuit diagram illustrating a program bias condition of a three-dimensional NAND flash memory device.

FIG. 9 is a circuit diagram illustrating a program bias condition of a three-dimensional NAND flash memory device.

For convenience of description, among a plurality of NAND strings of a memory block BLK, NAND strings NS11 and NS21 connected to a first bit line BL1, and NAND strings NS12 and NS22 connected to a second bit line BL2 are illustrated in FIG. 9.

The first bit-line BL1 may be or correspond to a program bit line to which a program permission voltage (e.g., 0 V) is applied, and the second bit-line BL2 may be a program inhibition bit line to which a program inhibition voltage such as a power supply voltage VCC is applied. If the NAND string NS21 among the NAND strings NS11 and NS21 is selected, during a program operation, a voltage of 0 V (e.g. a ground voltage) may be applied to a first string selection line SSL1, and the power supply voltage VCC may be applied to a second string selection line SSL2.

The voltage of 0 V may be applied to ground selection lines GSL1 and GSL2. Furthermore, a voltage (e.g., a power voltage such as VCC) greater than 0 V may be applied to a common source line CSL. A program voltage VPGM (e.g., 18 V) may be applied to a selected word line (e.g., WL5) and a pass voltage VPPASS (e.g., 8 V) may be applied to unselected word lines (e.g., WL4 and WL6). Example embodiments are not limited to the above voltages.

Under the program bias condition, a voltage of, e.g., 18 V may be applied to a gate of a memory cell A having a channel voltage of 0 V. Since a strong electric field is formed between the gate and a channel of the memory cell A, the memory cell A may be programmed. However, since respective channels of memory cells C and D are in a floating state, channel voltages thereof may be boosted up to, for example, about 8 V, and thus, the memory cells C and D may not be programmed. The memory cell B may not be programmed because a weak electric field is formed between the gate of the memory cell B and the channel.

Figure 10:
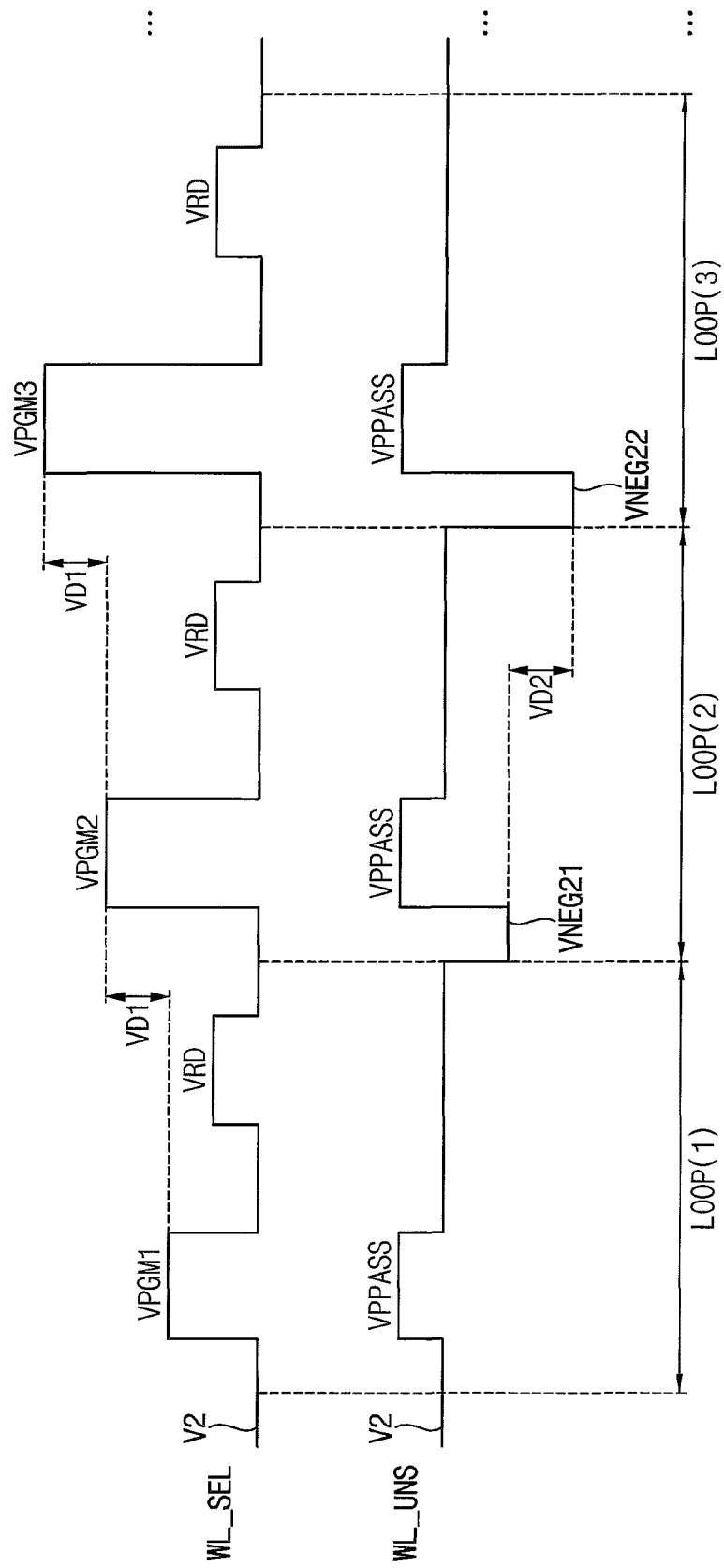
FIG. 10 is a diagram a plurality of program loops for an incremental step pulse programming (ISPP).
Figure 11:
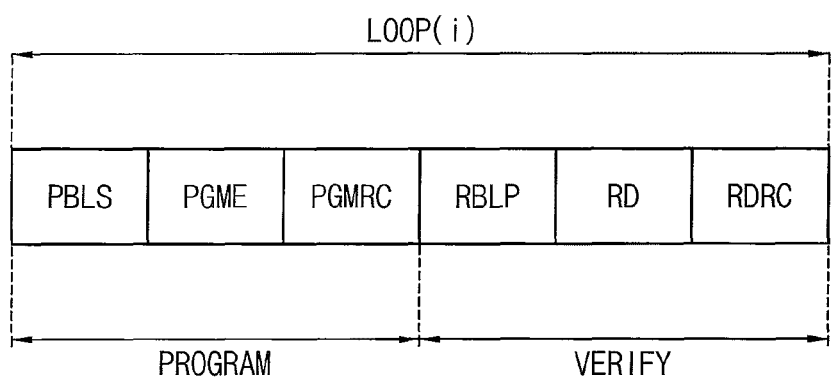
FIG. 11 is a diagram illustrating operation periods included in each of the program loops in FIG. 10.

FIG. 10 is a diagram a plurality of program loops for an incremental step pulse programming (ISPP), and FIG. 11 is a diagram illustrating operation periods included in each of the program loops in FIG. 10.

Referring to FIGS. 10 and 11, a plurality of program loops LOOP(1), LOOP(2) and LOOP(3) are performed sequentially according to ISPP until the program operation is completed. As the program loops are repeated, the program voltages VPGM1, VPGM2 and VPGM3 may be increased step-wisely/in a step-wise manner. The program voltages VPGM1, VPGM2 and VPGM3 may be increased step-wisely by a first voltage difference (e.g., a gap) VD1 as a number of the program loops increases. VD1 may be constant, or may be variable, and may be predetermined or alternatively determined during operation. In addition, as the program loops are repeated, second negative voltages VNEG21 and VNEG22 applied to the unselected word-line during the bit-line set-up period may be decreased step-wisely. The second negative voltages VNEG21 and VNEG22 may be decreased in a step-wise manner/step-wisely by a second voltage difference (e.g., a gap) VD2 as a number of the program loops increases. VD2 may be constant or may be variable, and may be predetermined, or alternatively determined during operation.

Each program loop LOO(i) may include a program period PROGRAM to apply each of the program voltages VPGM1, VPGM2 and VPGM3 to a selected word-line for programming the selected memory cells and a verification period VERIFY to apply a verification read voltage VPV to the selected word-line for verifying the success of the program operation.

The program period PROGRAM may include the bit-line set-up period PBLS, a program execution period PGME, and a program recovery period PGMRC. The verification period VERIFY may include a bit-line precharge period PBLP, a verification read period VFRD, and a read recovery period RDRC. The bit-line set-up period PBLS, the program execution period PGME, the program recovery period PGMRC, and the verification read period VFRD are the same as described with reference to FIG. 2.

During the bit-line set-up period PBLS of the first program loop LOOP(1), the channel of each of the cell strings is precharged to a first voltage by applying the second voltage V2 to the selected word-line and the unselected word-line. During the bit-line set-up period PBLS of each of the program loops LOOP(2) and LOOP(3) except the first program loop LOOP(1), the second voltage V2 is applied to the selected word-line while applying each of the second negative voltages VNEG21 and VNEG22, which are decreased step-wisely the number of the program loops increases, to the unselected word-line.

In some example embodiments, a difference between the negative voltage applied to the unselected word-line during the bit-line set-up period and a program pass voltage VPPASS applied to the unselected word-line during the program execution period is increased as the number of the program loops increases. As such, a booting effect may occur/be obtained, which is the same as in example embodiments when a fixed voltage applied to the unselected word-line during the bit-line set-up period and the program pass voltage VPPASS applied to the unselected word-line during the program execution period is increased step-wisely as the number of the program loops increases. Alternatively or additionally, a program disturb which occurs in the unselected cell string due to a difference between the program voltage and the program pass voltage may be the same as in example embodiments when fixed voltage applied to the unselected word-line during the bit-line set-up period and the program pass voltage VPPASS applied to the unselected word-line during the program execution period is increased step-wisely as the number of the program loops increases. Alternatively or additionally, a pass disturbance which occurs due to a level of the program pass voltage applied to the unselected word-lines of the selected cell string may decrease because the program pass voltage is fixed.

Figure 12:
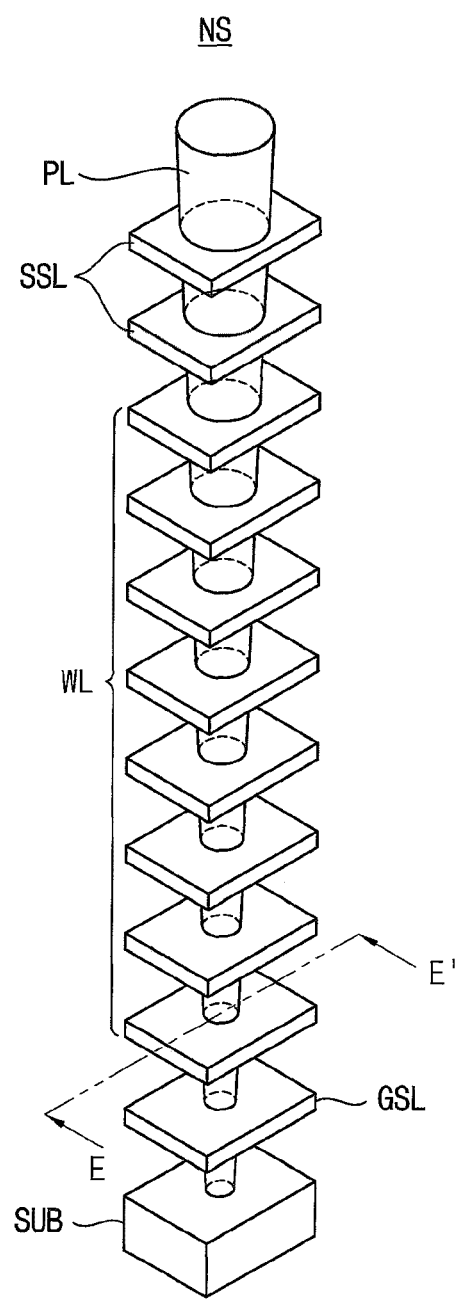
FIG. 12 is a diagram illustrating an example structure of a cell string.
Figure 13:
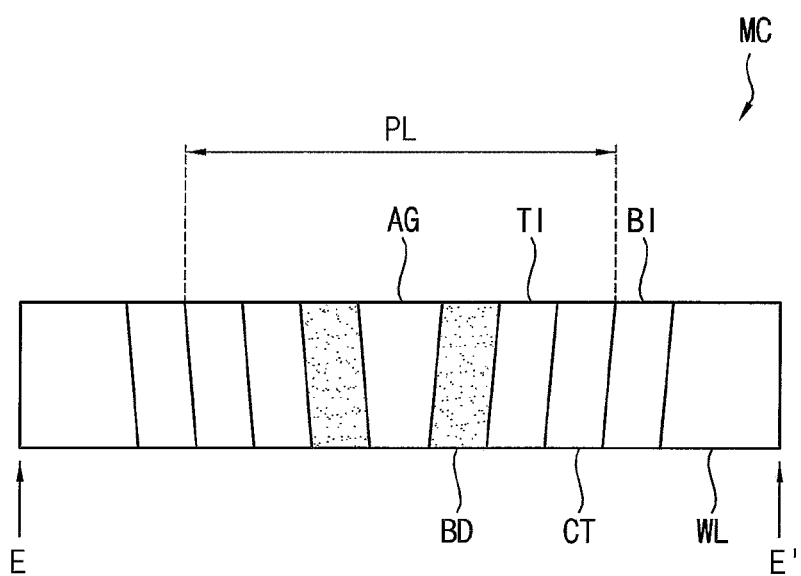
FIG. 13 is a diagram illustrating a memory cell included in the cell string of FIG. 12.

FIG. 12 is a diagram illustrating an example structure of a cell string, and FIG. 13 is a diagram illustrating a memory cell included in the cell string of FIG. 12.

Referring to FIGS. 12 and 13, a pillar PL extending in a vertical direction may be formed on a substrates SUB for providing the cell string NS. The ground selection line GSL, the word-lines WL, and the string selection lines SSL may be formed conductive materials such as metals, which are parallel to the substrate SUB. The pillar PL may penetrate the conductive materials forming ground selection line GSL, the word-lines WL and the string selection lines SSL to contact the substrate SUB. The word-lines WL may include dummy word lines. The pillar PL may have a tapered profile; however, example embodiments are not limited thereto.

FIG. 13 illustrates a cross-sectional view cut along the line E-E' in FIG. 12. As an example, a cross-section of one memory cell MC corresponding to a word line is illustrated in FIG. 13. The pillar PL may include a body BD in a form of a cylinder or a tapered cylinder, and an airgap AG may be provided in the body BD. The body BD may include silicon such as doped polysilicon of a P-type, and the body BD may be a region in which a channel is formed.

The pillar PL may further include a tunnel insulation layer TI surrounding the body BD and a charge capturing layer CT surrounding the tunnel insulation layer T1. A blocking insulation layer BI may be provided between one word line and the pillar PL. The body BD, the tunnel insulation layer TI, the charge capturing layer CT, the blocking insulation layer BI and the one word line may form a transistor of a charge capturing type. In some example embodiments, at least one of the string selection transistor SST, the ground selection transistor GST, and the other memory cells may have the same structure as illustrated in FIG. 13.

As illustrated in FIGS. 12 and 13, the width or the cross-section area of the pillar PL may be decreased as the distance to the substrate SUB is decreased; e.g. the pillar PL may have a tapered profile. When the same voltage is applied to the bodies of the ground selection transistor GST, the memory cells MC and the string selection transistor SST, and the same voltage is applied to the ground selection line GLS, the word lines WL and the string selection line SSL, the electric field formed in the memory cell located near the substrate SUB is greater than the electric field formed in the memory cell located far from the substrate SUB. These characteristics may affect the program disturbance during the program operation.

Figure 14:
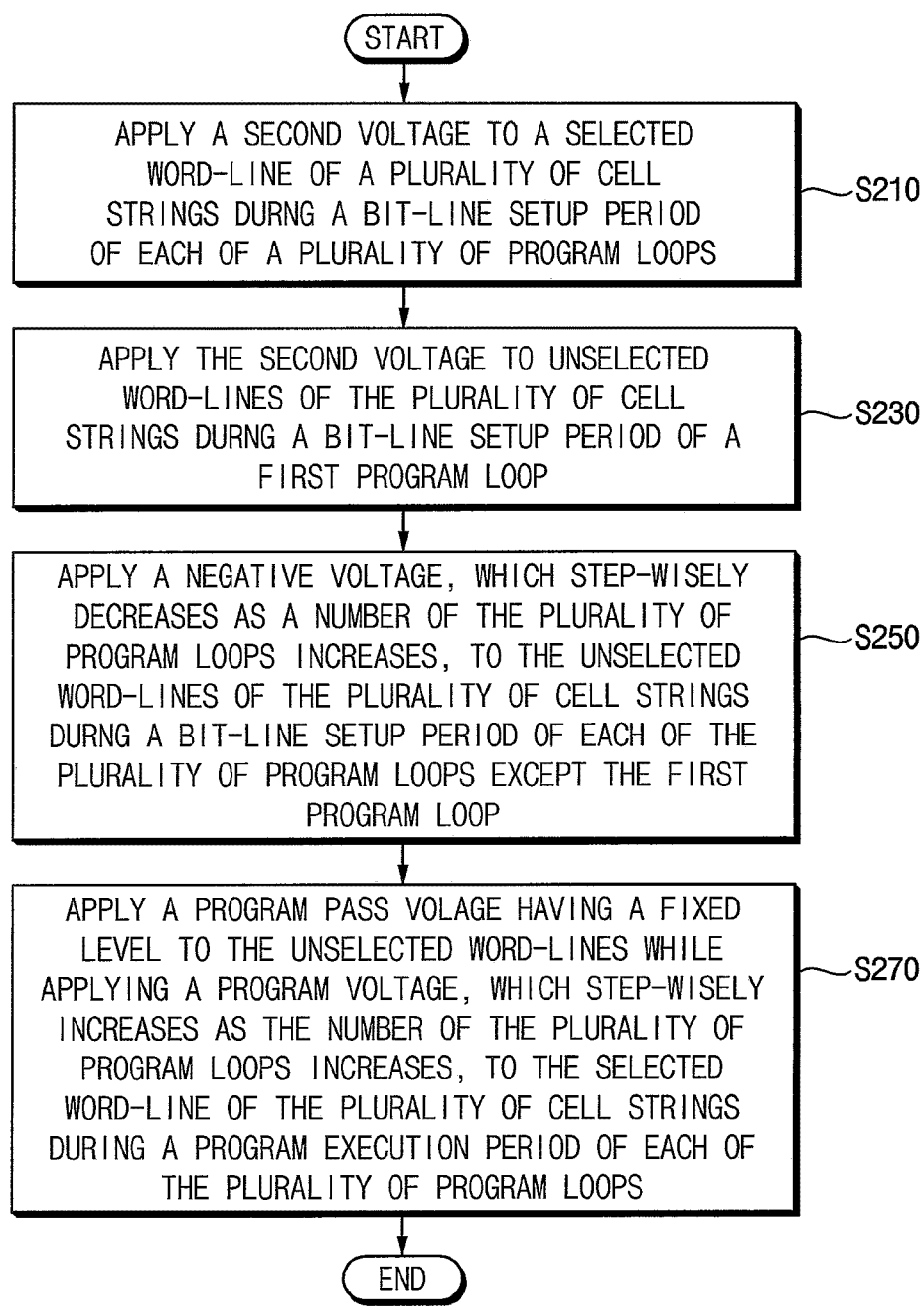
FIG. 14 is a flow chart illustrating a method of programming in a nonvolatile memory device according to some example embodiments.

FIG. 14 is a flow chart illustrating a method of programming in a nonvolatile memory device according to some example embodiments.

FIG. 14 illustrates a method of programming in a nonvolatile memory device including at least one memory block which includes a plurality of cell strings, where each cell string includes a string selection transistor, a plurality of memory cells, and a ground selection transistor connected between (e.g. directly connected between) a bit line and a source line.

Referring to FIGS. 10 and 14, a second voltage V2 is applied to a selected word-line of the plurality of cell strings for precharging a channel of each of the plurality of cell strings to a first voltage during a bit-line set-up period of each of a plurality of program loops (operation S210).

A second voltage V2 is applied to unselected word-lines of the plurality of cell strings during the bit-line set-up period of a first program loop from among the plurality of program loops (operation S230). A negative voltage, e.g. a voltage less than the ground voltage, which is decreased step-wisely as a number of the program loops increases, to the unselected word-lines during the bit-line set-up period of each of the plurality of program loops except the first program loop (operation S250).

A program voltage, which is increased step-wisely as a number of the program loops increases, to the selected word-line during a program execution period of each of the plurality of program loops while a program pass voltage having a fixed level is applied to the unselected word-lines (operation S270).

As described with reference to FIG. 10, a difference between the negative voltage applied to the unselected word-line during the bit-line set-up period and a program pass voltage VPPASS applied to the unselected word-line during the program execution period is increased as the number of the program loops increases. As such, a booting effect may be obtained, which is the same as in example embodiments when a fixed voltage applied to the unselected word-line during the bit-line set-up period and the program pass voltage VPPASS applied to the unselected word-line during the program execution period is increased step-wisely as the number of the program loops increases. Alternatively or additionally, a pass disturbance which occurs due to a level of the program pass voltage applied to the unselected word-lines of the selected cell string may decrease because the program pass voltage is fixed.

Figure 15A:
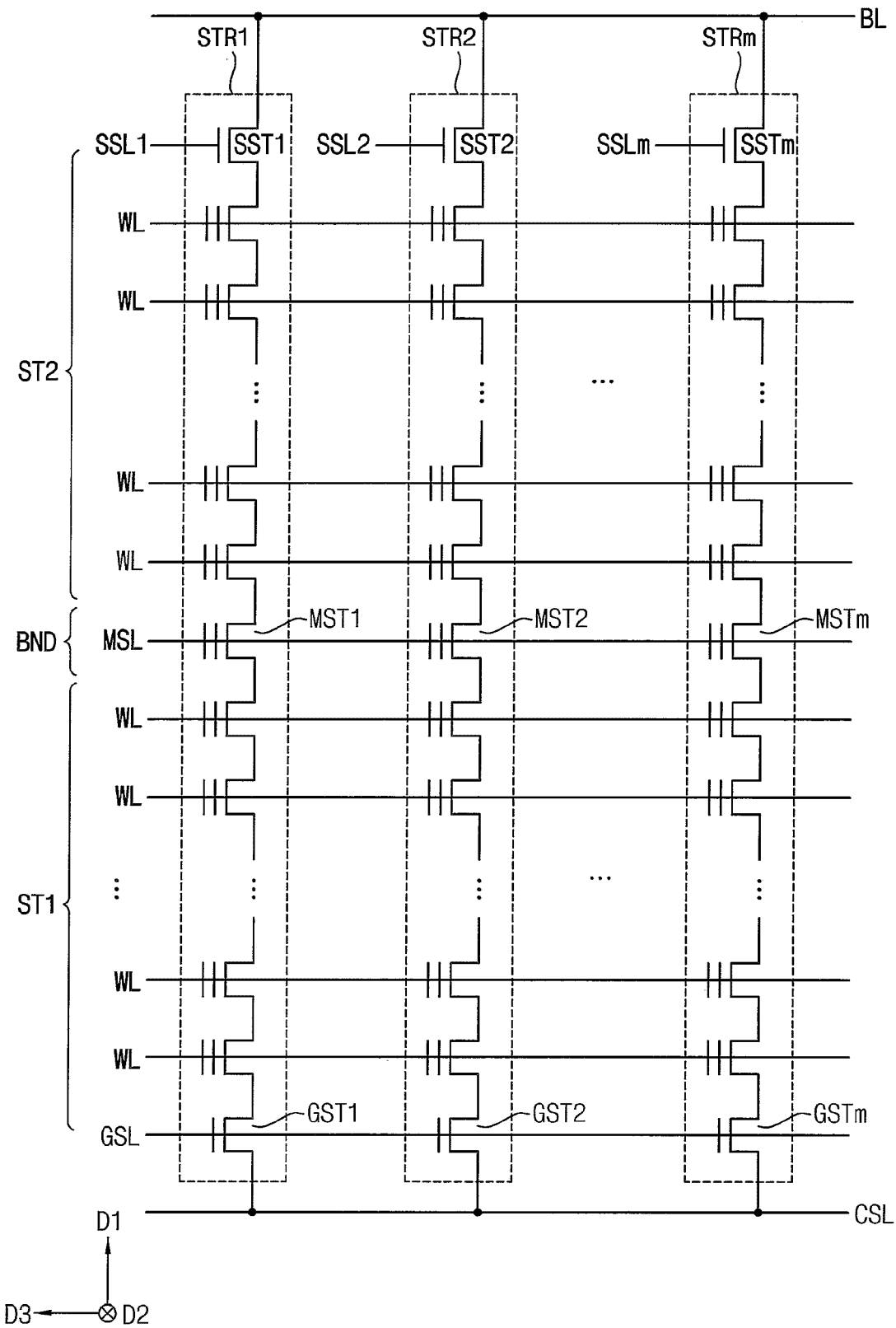
FIG. 15A is a circuit diagram illustrating a structure of a memory cell array according to some example embodiments.
Figure 15B:
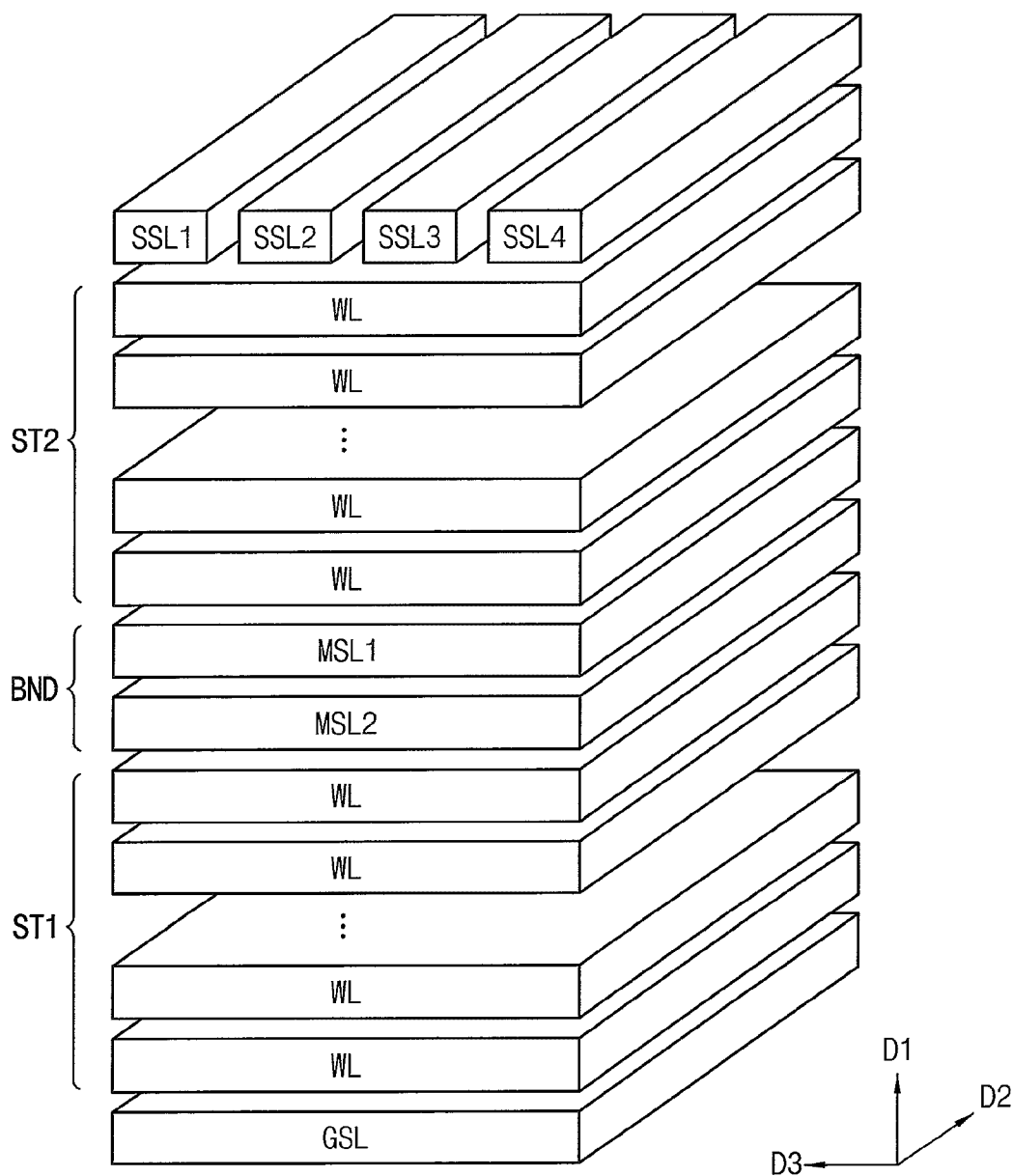
FIG. 15B is a perspective view illustrating a memory block corresponding to a structure of FIG. 15A.

FIG. 15A is a circuit diagram illustrating a structure of a memory cell array according to some example embodiments, and FIG. 15B is a perspective view illustrating a memory block corresponding to a structure of FIG. 15A.

FIG. 15A illustrates two-dimensional version of a memory block including cell strings connected to one bit-line BL and to one source line CSL for convenience of illustration, but it will be understood that the memory block may have a three-dimensional structure of a plurality of bit-lines as described with reference to FIGS. 5 and 6.

Referring to FIGS. 15A and 15B, a memory block may include a plurality of cell strings STR1~STRm connected between a bit-line BL and a source line CSL. The cell strings STR1~STRm may include string selection transistors SST1~SSTm controlled by string selection lines SSL1~SSLm, memory cells controlled by word-lines WL, intermediate switching transistors MST1~MSTm controlled by an intermediate switching line MSL and a ground selection transistors GST1~GSTm controlled by a ground selection line GSL, respectively. Here, m is a natural number greater than 1. The memory cells connected to word-lines disposed in edge portions of the stacks ST1 and ST2 may be dummy cells.

FIG. 15A illustrates some example embodiments in which the ground selection transistors GST1~GSTm are connected to the same ground selection line GSL. In some example embodiments, the ground selection transistors are connected to the respective ground selection lines.

In some example embodiments, as illustrated in FIGS. 15A and 15B, the boundary portion BND may include one gate line MSL that switches or activates simultaneously the intermediate switching transistors connected thereto.

Figure 16:
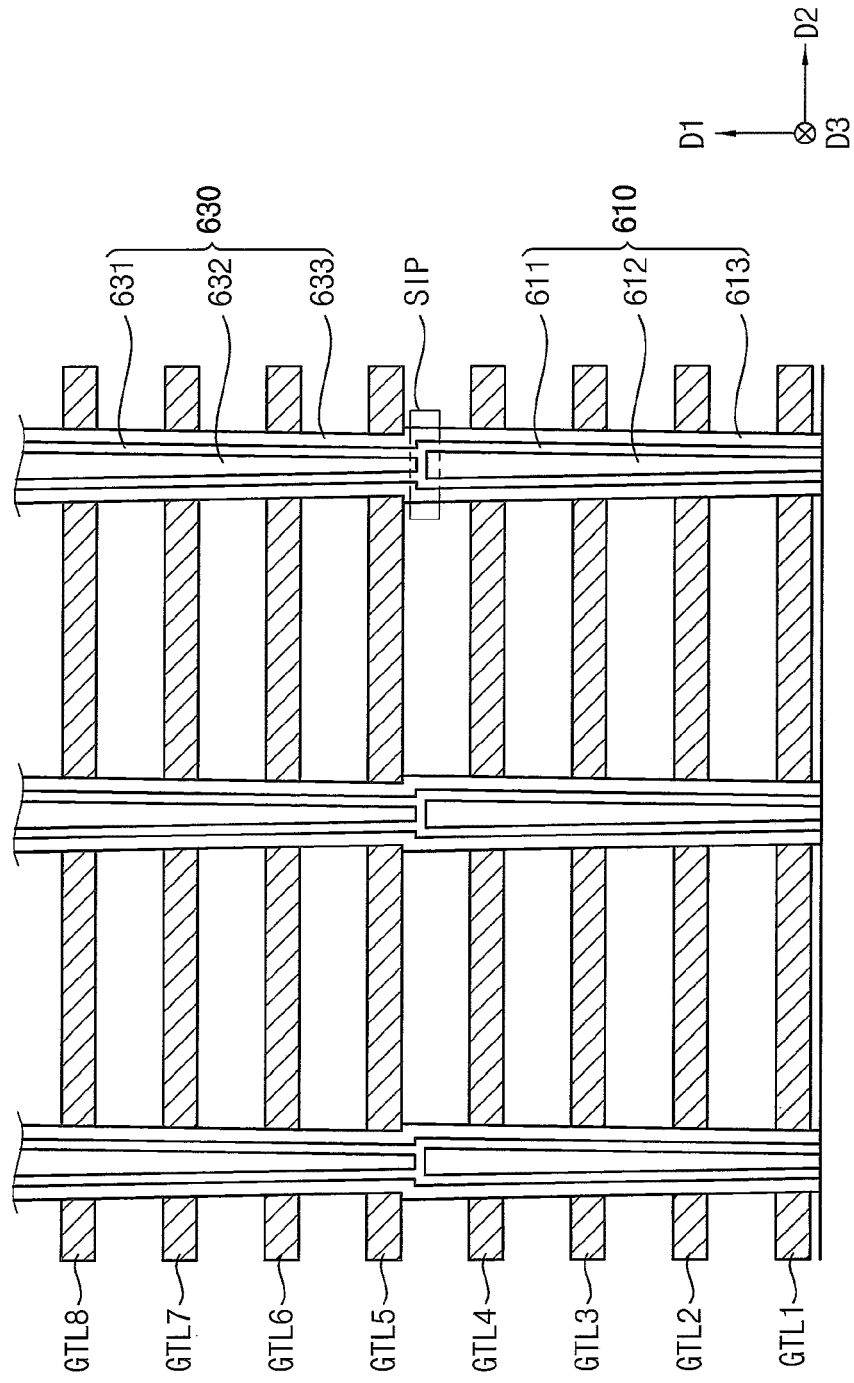
FIG. 16 is a cross-sectional view for describing an example embodiment of a boundary portion included in a memory block according to some example embodiments.

FIG. 16 is a cross-sectional view for describing some examples of a boundary portion included in a memory block according to some example embodiments.

Referring to FIG. 16, a channel hole of each cell string STR may include a first sub channel hole 610 and a second sub channel hole 630. A channel hole may be referred to as a pillar. The first sub channel hole 610 may include a channel layer 611, an inner material 612 and an insulation layer 613. The second sub channel hole 630 may include a channel layer 631, an inner material 632 and an insulation layer 633. The channel layer 611 of the first channel hole 610 may be connected to the channel layer 631 of the second sub channel hole 630 through a P-type silicon pad SIP. The sub channel holes 610 and 630 may be formed using a stopper line GTL5 having an appropriate etch rate. For example, the stopper line GTL5 may be formed of or include or consist of doped or undoped polysilicon and the other gate lines GTL1~GTL4 and the GTL6~GTL8 may be formed or include or consist of metal such as tungsten to implement the appropriate etch rate. A number of gate lines GTL6~GTL8 may be one more than a number of gate lines GTL1~GTL4; however, example embodiments are not limited thereto.

The above-described boundary portion BND may correspond to the stopper layer GTL5 that is used to form the plurality of sub channel holes. The cells in the stopper layer GTL5 may be improper for storing data, and the stopper layer may be used as the boundary portion BND to from the intermediate switching transistors. Some example embodiments are not limited to a boundary portion of one stopper layer, and the boundary portion may include two or more gate layers.

Figure 17:
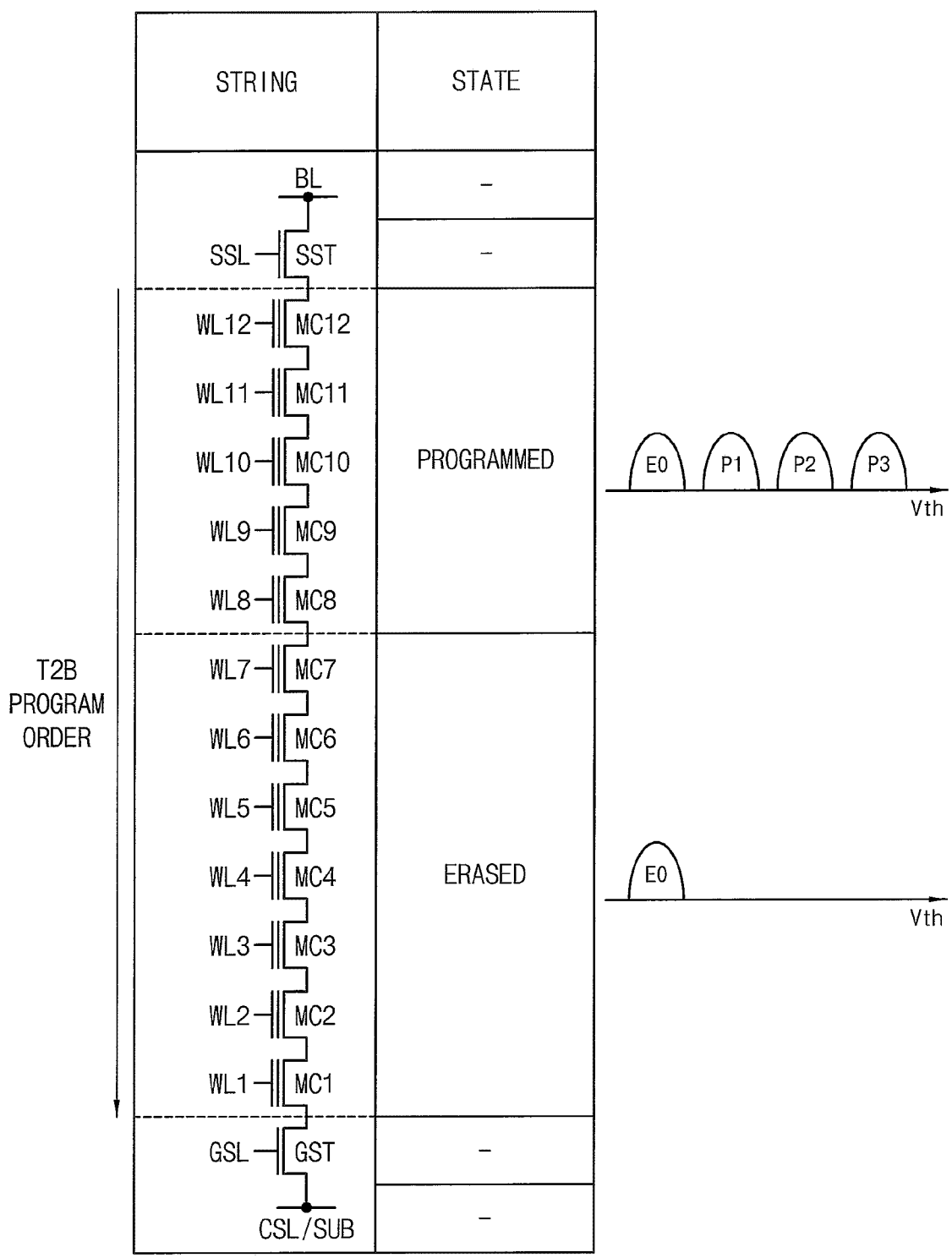
FIG. 17 is a diagram illustrating a first program scenario according to some example embodiments.

FIG. 17 is a diagram illustrating a first program scenario according to some example embodiments.

FIG. 17 illustrates one cell string including a string selection transistor SST connected to a string selection line SSL, a ground selection transistor GST connected to a ground selection line GSL and memory cells MC1~MC12 connected to word-lines WL1~WL12 and states of memory cells. The cell string is connected between a bit-line BL, a source line CSL and a substrate voltage SUB. FIG. 17 illustrates a non-limiting example of twelve memory cells and an MLC storing two bits; however, there may be more than twelve or less than twelve memory cells.

Referring to FIG. 17, according to a first program scenario, the program operation may be performed in a downward direction from an uppermost word-line. For example, as the data stored in the memory block increase, the data may be filled in erased cells in the downward direction from top to bottom (T2B program order).

The unprogrammed memory cells MC1~MC7 are in an erased state E0, and each of the programmed memory cells MC8~MC12 may be in one of the erased state E0 and programmed states P1, P2 and P3.

Figure 18:
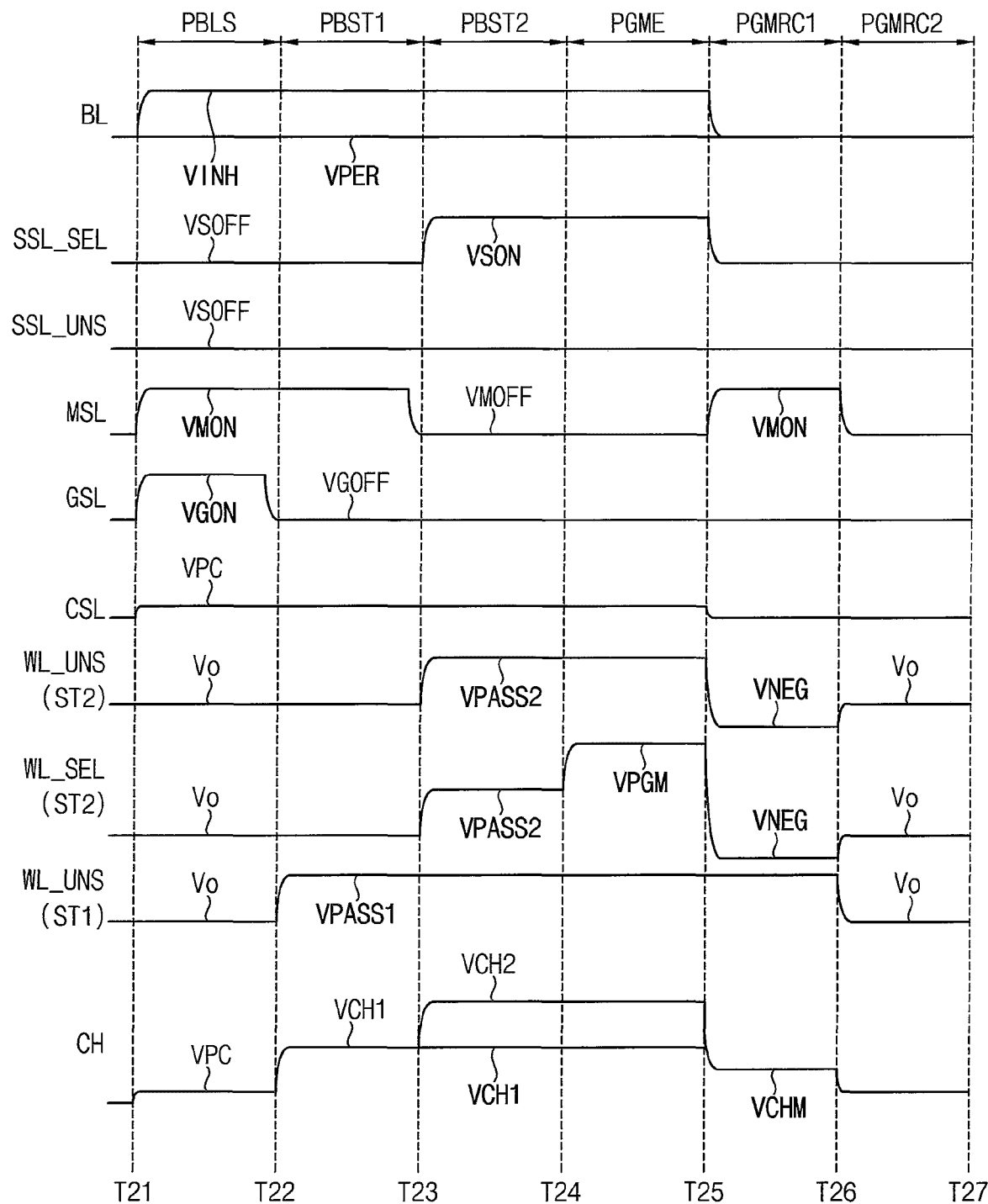
FIG. 18 is a timing diagram illustrating a program operation of a second stack according to the first program scenario of FIG. 17.

FIG. 18 is a timing diagram illustrating a program operation of a second stack according to the first program scenario of FIG. 17.

FIG. 18 illustrates a boosting operation and a program recovery operation by controlling intermediate switching transistors when a selected word-line WLs corresponding to a program address is included in the second stack ST2. For example, the first stack ST1 corresponds to an erased stack indicating a stack in which all memory cells are in an erased state, and the second stack ST2 corresponds to a selected stack indicating a stack that includes memory cells to be programmed.

Time interval T21~T22 is a precharge period PPC, time interval T22~T23 is a first boosting period PBST1, time interval T23~T24 is a second boosting period PBST2, time interval T24~T25 is a program execution period PGME while a program voltage VPGM is applied to the selected word-line WLs, time interval T25~T26 is a first program recovery period PGMRC1, and time interval T26~T27 is a second program recovery period PGMRC2. Hereinafter, a turn-on voltage and a turn-off voltage represent voltage of levels to turn on and off a corresponding transistor.

A program inhibition voltage VINH may be applied to the bit-line BL when the bit-line BL is a program inhibition bit-line and a program permission voltage VPER may be applied to bit-line BL when the bit-line BL is a program permission bit-line.

During the precharge period PPC, a turn-off voltage VSOFF is applied to a selected string selection line SSLs and unselected string selection line SSLu, a turn-on voltage VMON is applied to an intermediate switching line MSL and a turn-on voltage VGON is applied to a ground selection line GSL. The ground selection transistor and the intermediate switching transistor are turned on, and thus a precharge voltage VPC of the source line CSL is applied to the channels CH of the first stack ST1 and the second stack ST2.

As such, the precharge voltage VPC may be applied to the channels of the first stack ST1 and the second stack ST2 before performing the boosting operation of the first boosting period PBST1 and the second boosting period PBST2. During the precharge period PPC, an initialization voltage Vo may be applied to a selected word-line WLs and unselected word-lines WLu. The initialization voltage Vo may have a voltage level capable of turning on the erased memory cells. The programmed memory cells in the second stack ST2 are turned off and the channel portion between the bit-line BL and the programmed memory cell may float/electrically float.

During the first boosting period PBST1, the intermediate switching line MSL maintains the turn-on voltage VMON, a turn-off voltage VGOFF is applied to the ground selection line GSL, and the channels of the first stack ST1 and the second stack ST2 float. A first pass voltage VPASS1 is applied to the word-lines WLu(ST1) of the first stack ST1 corresponding to the erased stack while the intermediate transistors are turned on. As a result, the channels CH of the first stack ST1 and the second stack ST1 may be boosted to a first channel voltage VCH1. The first channel voltage VCH1 may be determined approximately as Equation 1.

$$VCH1 = VPC + VBST1 = VPC + VPASS1 * N1/[(N2-Np) + N1]$$ 
Equation 1

In Equation 1, VPC is the precharge voltage, VBST1 is a first booted voltage, N1 is the number of the word-lines of the first stack ST1, N2 is the number of the word-lines of the second stack ST2, Np is the number of the word-lines that are previously programmed in the second stack ST2. As represented by Equation 1, the first boosted voltage VBST1 increases and the number Np increases.

During the second boosting period PBST2, a turn-on voltage VSON is applied to the selected string selection line SSLs, a turn-off voltage VMOFF is applied to the intermediate switching line MSL and thus the first stack ST1 and the second stack ST2 are electrically disconnected from each other floated. A second pass voltage VPASS2 is applied to the word-lines WLu(ST2) and WLs(ST2) of the second stack ST2 corresponding to the selected stack while the intermediate transistors are turned off. As a result, the channels CH of the first stack ST1 may maintain the first channel voltage VCH1 and the channels of the second stack ST1 may be further boosted to a second channel voltage VCH2. Even though not illustrated, the channels of the selected cell string may have the program permission voltage VPER or, alternatively, the program inhibition voltage VINH according to the bit-line voltage because the turn-on voltage VSON is applied to the selected string selection line SSLs. The second channel voltage VCH2 may be determined approximately as Equation 2.

$$VCH2 = VCH1 + VBST2 = VPC + VBST1 + VST1$$

$$= VPC + VPASS1 * N1/[(N2-Np) + N1] + VPASS2$$

In Equation 2, VBST2 is a second booted voltage, and the second boosted voltage VBST2 corresponds to the second pass voltage VPASS2.

After the precharge period PPC, a turn-off voltage VGOFF is applied to the ground selection line GSL to electrically disconnect the cell strings from the source line CSL.

During program execution period PGME, a program voltage VPGM is applied to the selected word-line WLs (ST2) of the second stack ST2 corresponding to the selected stack and the selected memory cells connected to the bit-lines BL to which the program permission voltage VPER is applied may be programmed.

As such, the boosting operation according to some example embodiments may include the first boosting operation of the first boosting period PBST1 and the second boosting operation of the second boosting period PBST2, which may be referred to as double boosting.

The first boosting operation may be performed, for example, by applying the first pass voltage VPASS1 to the word-lines of the erased stack ST1 among the plurality of stacks ST1 and ST2 while the plurality of intermediate transistors are turned on by applying the turn-on voltage VMON to the intermediate switching line MSL during the first boosting period PBST1.

The second boosting operation may be performed, for example, after the first pass voltage VPASS1 is applied to the word-lines of the erased stack ST1, applying the second pass voltage VPASS2 to the word-lines of the selected stack ST2 among the plurality of stacks ST1 and ST2 while the plurality of intermediate transistors are turned off by applying the turn-off voltage VMOFF to the intermediate switching line MSL during the second boosting period PBST2.

The channels of the erased stack ST1 and the channels of the selected stack ST2 are electrically connected to each other by the turning-on of the plurality of intermediate switching transistors while the first pass voltage VPASS1 is applied to the word-lines of the erased stack ST1 during the first boosting period PBST1. In contrast, the channels of the erased stack ST1 and the channels of the selected stack ST2 are electrically disconnected from each other by the turning-off of the plurality of intermediate switching transistors while the second pass voltage VPASS2 is applied to the word-lines of the selected stack ST2 during the second boosting period PBST2.

Accordingly, as represented by Equation 1 and Equation 2, the channels of the erased stack ST1 and the channels of the selected stack ST2 are boosted to the first channel voltage VCH1 by the first boosting operation, and only the channels of the selected stack ST2 are further boosted to the second channel voltage VCH2 by the second boosting operation. At time point T4 when the second boosting operation is completed, the second channel voltage VCH2 of the selected stack ST2 becomes higher than the first channel voltage VCH1 of the erased stack ST1.

During the first program recovery period PGMRC1, a plurality of intermediate switching transistors are turned-on by applying the turn-on voltage VMON to the intermediate switching line MSL after lowering voltage levels of the word-lines of the selected stack ST2 to a negative voltage VNEG smaller than the ground voltage.

During the second program recovery period PGMRC2, voltage levels of the word-lines of the selected stack ST2 are recovered from the negative voltage VNEG to an initial voltage Vo while reducing voltage levels of the word-lines of the erased stack ST1 from the first pass voltage VPASS1 to the initial voltage Vo.

Therefore, the channels of the erased stack ST1 and the channels of the selected stack ST2 are electrically coupled by turning on the intermediate switching transistors after reducing voltage level of channel of the selected stack ST2 to the negative voltage during the first program recovery period PGMRC1. Then, the voltage levels of the selected stack ST2 and the erased stack ST1 may be reduced.

Accordingly, when voltage levels of word-lines WL_UNS (ST2) and WL_SEL(ST2) of the second stack ST2 are increased, the soft erase phenomenon which may occur in the unselected cell string and/or the hot carrier injection (HCl) phenomenon which may occur in the selected cell string may be reduced or prevented.

Figure 19A:
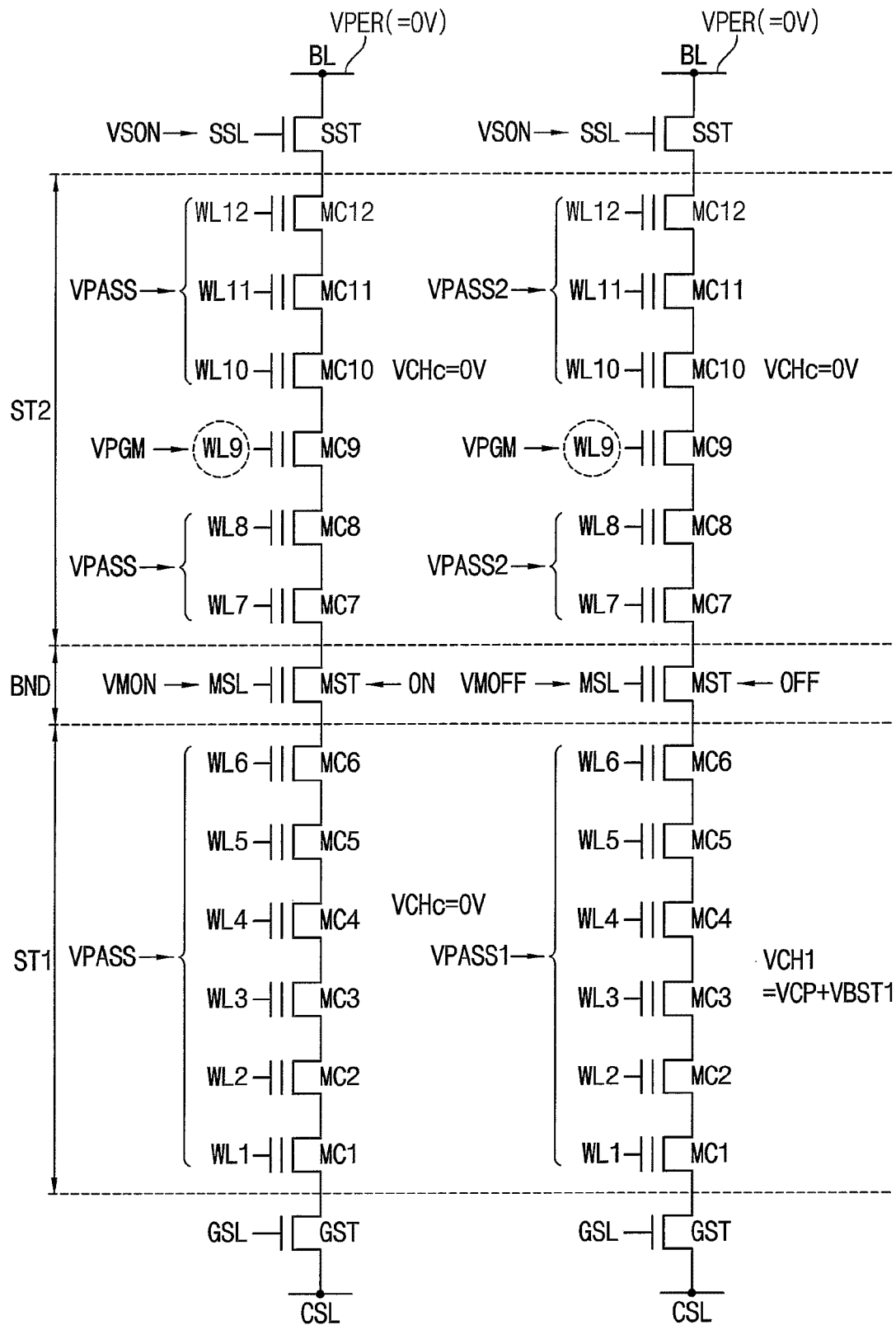
FIG. 19A is a diagram for describing decrease in pass voltage disturbance in a nonvolatile memory device according to some example embodiments.
Figure 19B:
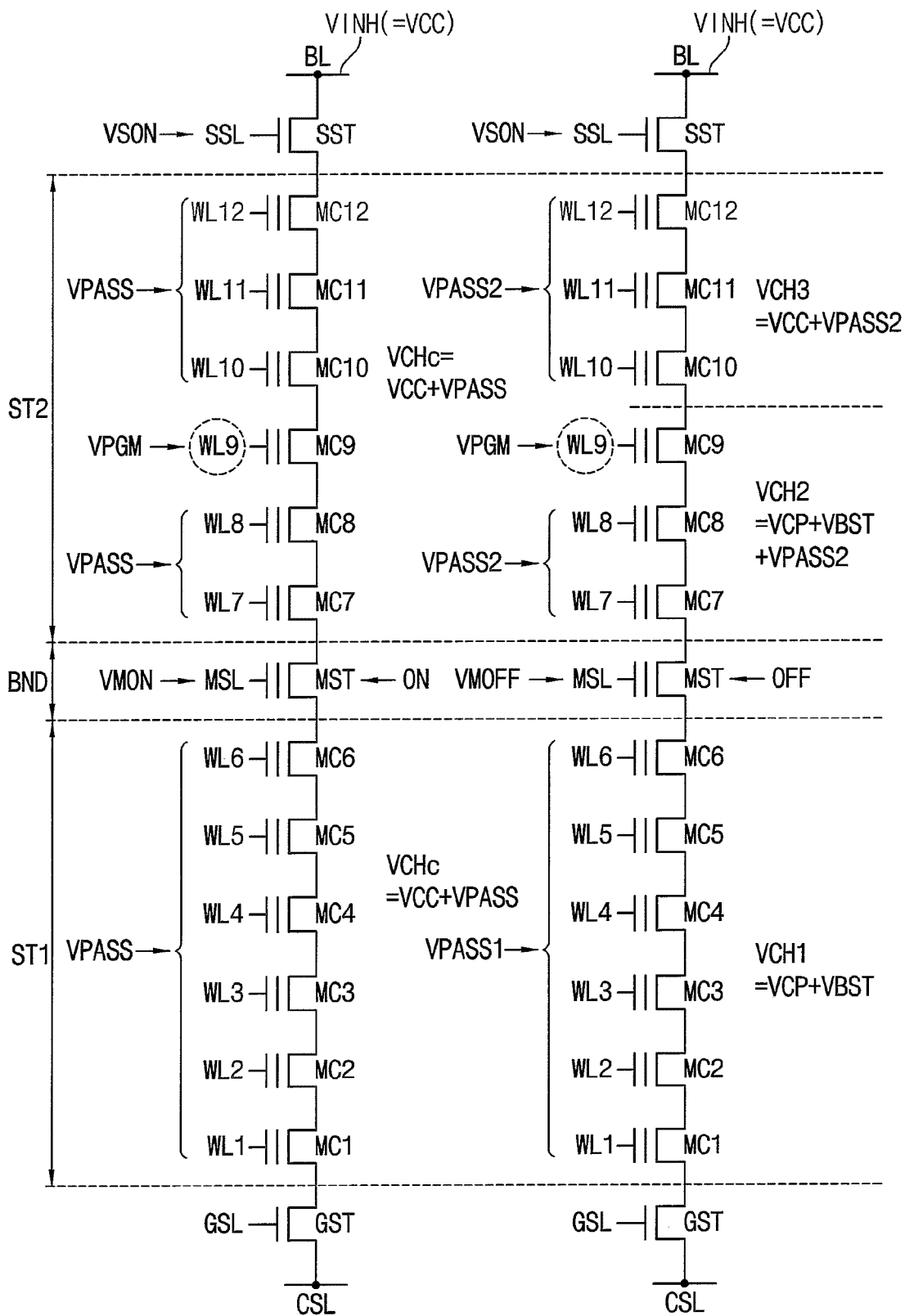
FIG. 19B is a diagram for describing decrease in program voltage disturbance of a nonvolatile memory device according to some example embodiments.

FIG. 19A is a diagram for describing a decrease in pass voltage disturbance in a nonvolatile memory device according to some example embodiments, and FIG. 19B is a diagram for describing a decrease in program voltage disturbance of a nonvolatile memory device according to some example embodiments.

FIGS. 19A and 19B illustrate a structure of a cell string connected between a bit-line BL and a source line CSL where the cell string includes a string selection transistor SST connected to a string selection line SSL, a plurality of memory cells MC1~MC12 connected to word-lines WL1~WL12, respectively, an intermediate switching transistor MST connected to an intermediate switching line MSL, and a ground selection transistor GST connected to a ground selection line GSL, which are disposed vertically.

The left portions of FIGS. 19A and 19B illustrate examples according to a conventional scheme and right portion of FIGS. 19A and 19B illustrate examples according to some example embodiments. The cell string of FIGS. 19A and 19B is a selected cell string such that a turn-on voltage VSON is applied to the string selection line SSL. A first stack ST1 corresponds to an erased stack in which all memory cells are in an erased state, and a second stack ST2 corresponds to a selected stack that includes memory cells to be programmed presently.

FIG. 19A illustrates channel voltages of the cell string when a program permission voltage VPER is applied to the bit-line BL.

In examples of a conventional method, the turn-on voltage VMON is applied to the intermediate switching line MSL corresponding to a dummy word-line, the intermediate switching transistor MST is turned on and thus the channel voltage VCHc of the erased stack ST1 becomes equal to the channel voltage VCHc of the selected stack ST2. Accordingly, the voltage difference between the channels and the gate electrodes of the memory cells MC1~MC6 of the erased stack ST1 is the pass voltage VPASS.

In contrast, in example embodiments of double boosting according to some example embodiments, the turn-off voltage VMOFF is applied to the intermediate switching line MSL, the intermediate switching transistor MST is turned off and thus the channels of the erased stack ST1 is boosted to the first channel voltage VCH1. In some example embodiments, the voltage difference between the channels and the gate electrodes of the memory cells MC1~MC6 of the erased stack ST1 is VPASS1-VCH1. As a result, the pass voltage disturbance of the erased stack ST1 may be reduced or prevented by the double boosting according to some example embodiments.

FIG. 19B illustrates channel voltages of the cell string when a program inhibition voltage VINH is applied to the bit-line BL.

In examples of a conventional method, the turn-on voltage VMON is applied to the intermediate switching line MSL corresponding to a dummy word-line, the intermediate switching transistor MST is turned on and thus the channel voltage VCHc of the erased stack ST1 becomes equal to the channel voltage VCHc of the selected stack ST2. Accordingly, the voltage difference between the channel and the gate electrode of the memory cell MC9 to which the program voltage VPGM is VPGM-VCC-VPASS.

In contrast, in examples of double boosting according to some example embodiments, the turn-off voltage VMOFF is applied to the intermediate switching line MSL, and the intermediate switching transistor MST is turned off. Thus the channels of the erased stack ST1 is boosted to the first channel voltage VCH1, the channels of the erased memory cells MC7~MC9 of the selected stack ST2 is boosted to the second channel voltage VCH2 and the channels of the programmed memory cells MC10~MC12 of the selected stack ST2 is boosted to the third channel voltage VCH3.

In example embodiments, the voltage difference between the channel and the gate electrode of the memory cell MC9 to which the program voltage VPGM is VPGM-VCC-VBST-VPASS2. As a result, the program voltage disturbance of the memory cell MC9 to which the program voltage VPGM may be reduced in likelihood of occurrence, or prevented, by the double boosting according to some example embodiments.

Alternatively or additionally, since the program recovery operation is performed after performing double boosting, the soft erase which may occur in the unselected cell string and the HCl which may occur in the selected cell string may be reduced or prevented.

Figure 20:
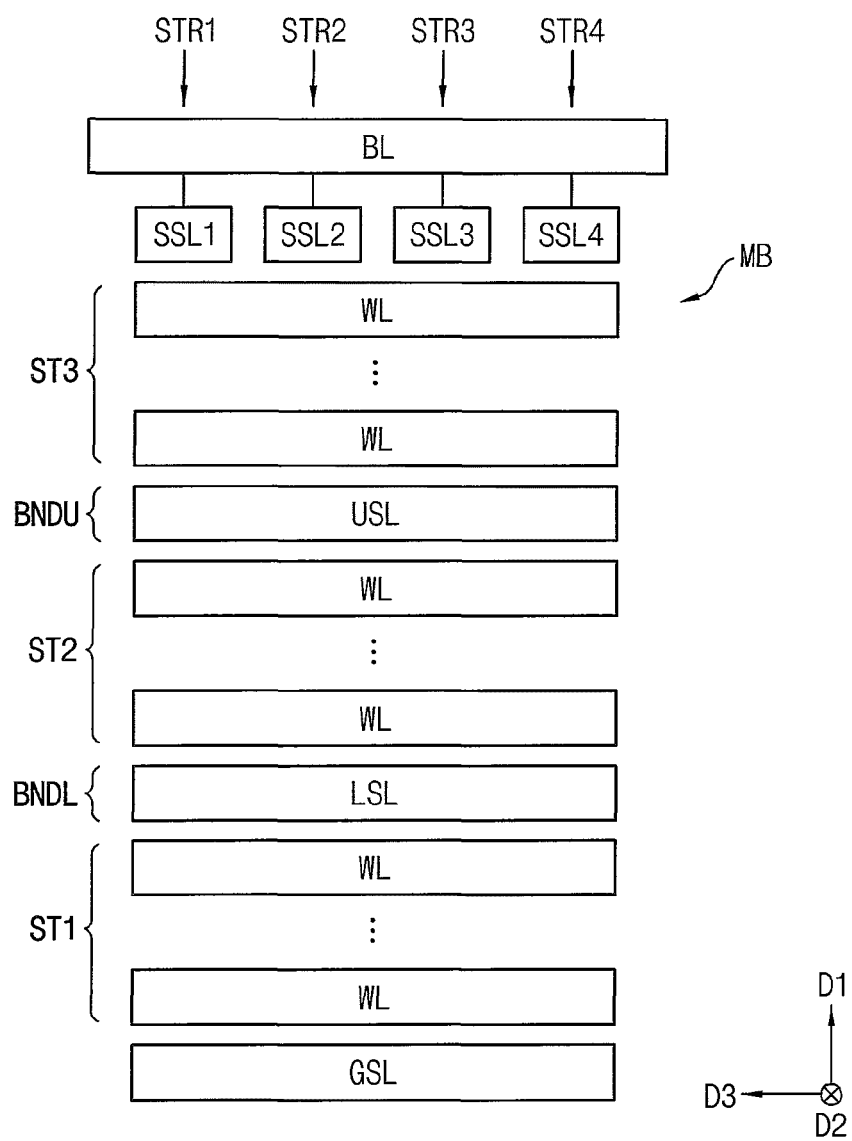
FIG. 20 is a cross-sectional view illustrating a memory block divided into three stacks according to some example embodiments.

FIG. 20 is a cross-sectional view illustrating a memory block divided into three stacks according to some example embodiments.

Referring to FIG. 20, the above-described boundary portion BND may include a lower boundary portion BNDL and an upper boundary portion BNDU. A memory block MB may include a first stack ST1 below the lower boundary portion BNDL, a second stack ST2 between the lower boundary portion BNDL and the upper boundary portion BNDU, and a third stack ST3 above the upper boundary portion BNDU. A number of word lines WL in each of the first stack ST1, the second stack ST2, and the third stack ST3 may be the same as, or different from, each other.

The above-described intermediate switching transistors may include a plurality of lower switching transistors disposed in the lower boundary portion BNDL and connected to a lower switching line LSL and a plurality of upper switching transistors disposed in the upper boundary portion BNDU and connected to an upper switching line USL.

FIGS. 21A and 21B are diagrams illustrating a program operation with respect to stacks of the memory cell array of FIG. 20 according to the first program scenario of FIG. 17. The repeated descriptions with FIG. 18 may be omitted.

FIGS. 21A and 21B illustrate voltages during the above-described precharge period PPC, the first boosting period PBST1. the second boosting period PBST2, the program execution period PGME, the first program recovery period PGMRC1 and the second program recovery period PGMRC2.

FIG. 21A corresponds to example embodiments where the program operation is performed to the third stack ST3 according to the above-described first program scenario T2B. In some example embodiments, the first stack ST1 and the second stack ST2 correspond to the above-describe erased stacks and the third stack ST3 corresponds to the above-described selected stack.

During the precharge period PPC and the first boosting period PBST1, turn-on voltages VLON and VUON are applied to the lower switching line LSL and the upper switching line USL, respectively. During the second boosting period PBST2, turn-off voltages VLOFF and VUOFF are applied to the lower switching line LSL and the upper switching line USL, respectively.

During the program execution period PGME, the program inhibition voltage VINH or the program permission voltage VPER may be applied to the bit-line BL, the turn-on voltage VSON may be applied to the string selection line SSL, the program voltage VPGM may be applied to the selected word-line of the third stack ST3, the second pass voltage VPASS2 may be applied to the unselected word-lines of the third stack ST3, and the first pass voltage VPASS1 may be applied to the word-lines of the second stack ST2 and the word-lines of the first stack ST1. Turn-off voltages VLOFF and VUOFF are applied to the lower switching line LSL and the upper switching line USL, respectively.

During the first program recovery period PGMRC1, the turn-off voltage VSOFF may be applied to the string selection line SSL, and the turn-on voltages VLON and VUON may be applied to the lower switching line LSL and the upper switching line USL, respectively. During the second program recovery period PGMRC1, the turn-off voltage VSOFF may be applied to the string selection line SSL, and the turn-off voltages VLOFF and VUOFF may be applied to the lower switching line LSL and the upper switching line USL, respectively. Other voltages may the same as described with reference to FIG. 18. The double boosting is performed on the third stack ST3 corresponding to the selected stack and the channel of the selected stack is recovered to the negative voltage and then recovered to the initial voltage Vo (the second voltage) by controlling switching operation of the intermediate switching transistors MC4 and MC8.

FIG. 21B corresponds to example embodiments where the program operation is performed to the second stack ST2 according to the above-described first program scenario T2B. In some example embodiments, the first stack ST1 corresponds to the above-describe erased stacks and the second stack ST2 corresponds to the above-described selected stack.

During the precharge period PPC and the first boosting period PBST1, turn-on voltages VLON and VUON may be applied to the lower switching line LSL and the upper switching line USL, respectively. During the second boosting period PBST2, turn-off voltages VLOFF and VUOFF may be applied to the lower switching line LSL and the upper switching line USL, respectively.

During the program execution period PGME, the program inhibition voltage VINH or alternatively the program permission voltage VPER may be applied to the bit-line BL, the turn-on voltage VSON may be applied to the string selection line SSL, the second pass voltage VPASS2 may be applied to the word-lines of the third stack ST3, the program voltage VPGM may be applied to the selected word-lines of the second stack ST2, the second pass voltage VPASS2 may be applied to the unselected word-lines of the second stack ST2, and the first pass voltage VPASS1 may be applied to the word-lines of the first stack ST1. Turn-off voltages VLOFF and VUOFF may be applied to the lower switching line LSL and the upper switching line USL, respectively.

During the first program recovery period PGMRC1, the turn-on voltage VLON and the turn-off voltage VUOFF may be applied to the lower switching line LSL and the upper switching line USL, respectively. During the second program recovery period PGMRC1 the turn-off voltages VLOFF and VUOFF may be applied to the lower switching line LSL and the upper switching line USL, respectively. Other voltages may be the same as described with reference to FIG. 18. The double boosting is performed on the second stack ST2 corresponding to the selected stack and the channel of the selected stack is recovered to the negative voltage and then recovered to the initial voltage Vo (the second voltage) by controlling switching operation of the intermediate switching transistors MC4 and MC8.

Figure 22:
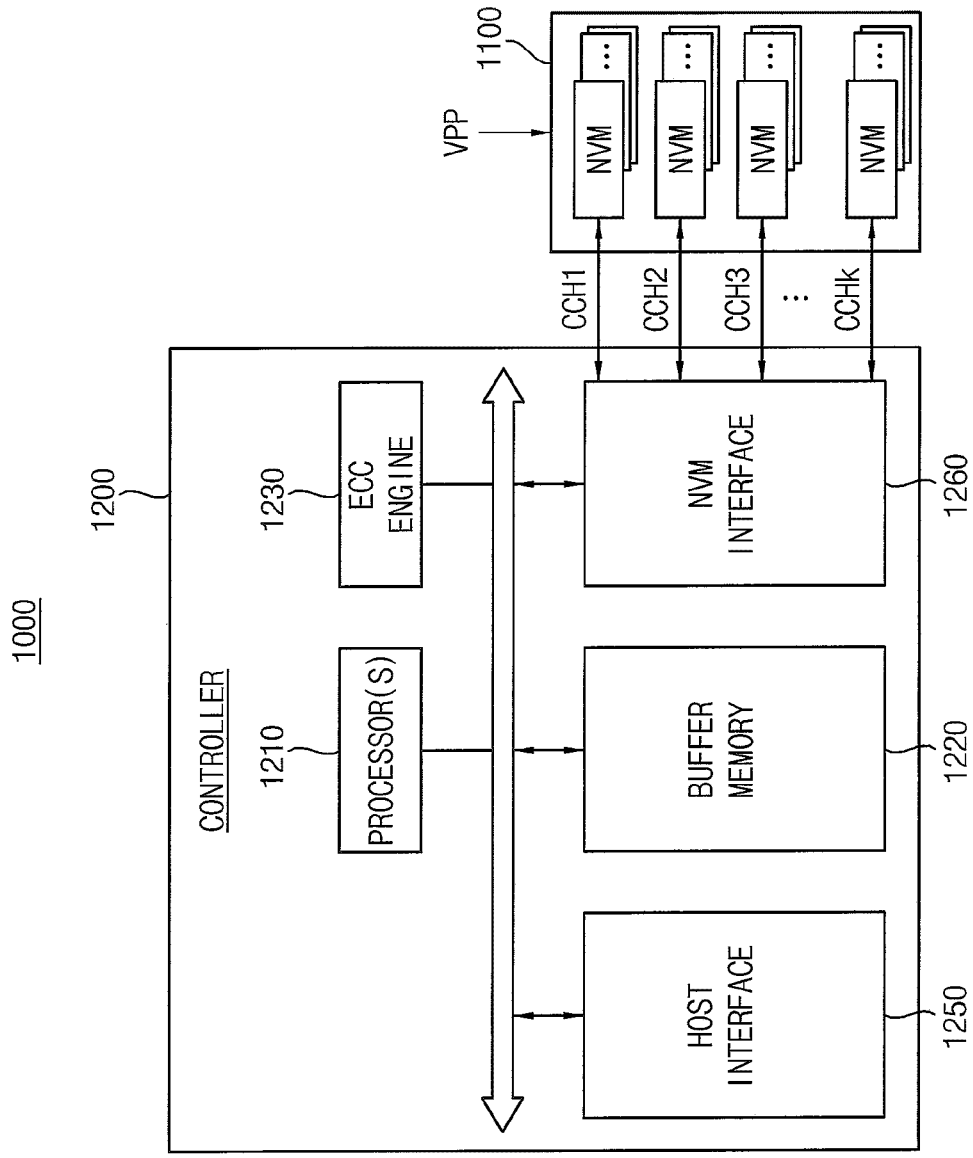
FIG. 22 is a block diagram illustrating a storage device that includes a nonvolatile memory device according to some example embodiments.

FIG. 22 is a block diagram illustrating a storage device that includes a nonvolatile memory device according to some example embodiments.

Referring to FIG. 22, a storage device 1000 includes a plurality of nonvolatile memory devices 1100 and a controller 1200. For example, the storage device 1000 may be or may include any storage device such as an embedded multimedia card (eMMC), a universal flash storage (UFS), a solid state disc or solid state drive (SSD), etc.

The controller 1200 may be connected to the nonvolatile memory devices 1100 via a plurality of channels CCH1, CCH2, CCH3, . . . , CCHk. The controller 1200 may include one or more processors 1210, a buffer memory 1220, an error correction code (ECC) engine 1230, a host interface 1250 and a nonvolatile memory (NVM) interface 1260.

The buffer memory 1220 may store data used to drive the controller 1200. The ECC circuit 1230 may calculate error correction code values of data to be programmed during a program operation, and may correct an error of read data using an error correction code value during a read operation. In a data recovery operation, the ECC engine 1230 may correct an error of data recovered from the nonvolatile memory devices 1100. The host interface 1250 may provide an interface with an external device (not shown). The nonvolatile memory interface 1260 may provide an interface with the nonvolatile memory devices 1100.

Each of the nonvolatile memory devices 1100 may correspond to the nonvolatile memory device according to some example embodiments, and may be optionally supplied with an external high voltage VPP.

Figure 23:
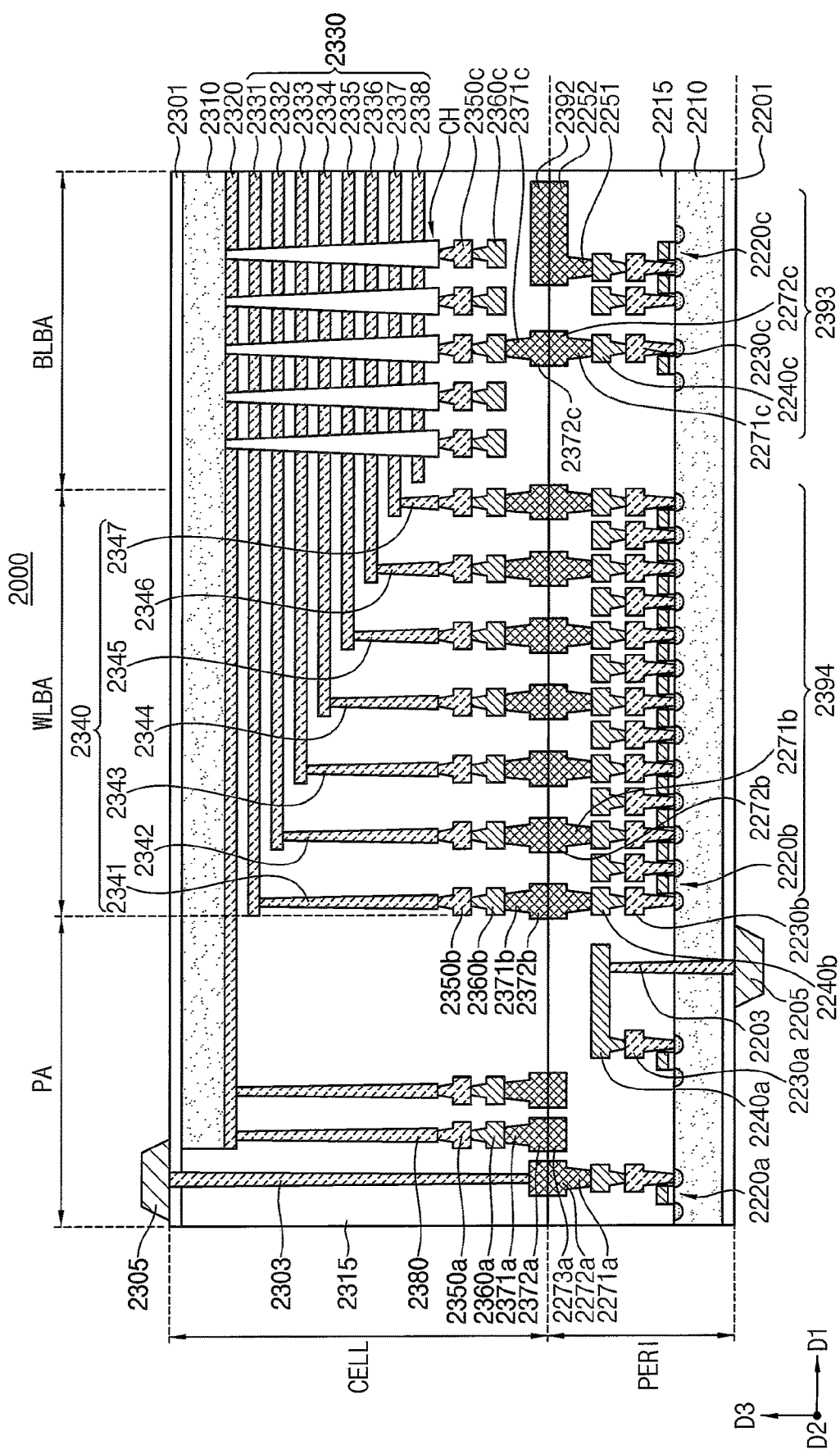
FIG. 23 is a cross-sectional view of a nonvolatile memory device according to some example embodiments.

FIG. 23 is a cross-sectional view of a nonvolatile memory device according to some example embodiments.

Referring to FIG. 23, a nonvolatile memory device or a memory device 2000 may have a chip-to-chip (C2C) structure. The C2C structure may refer to a structure formed by manufacturing/fabricating an upper chip including a memory cell region or a cell region CELL on a first wafer, manufacturing/fabricating a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu) using a Cu-to-Cu bonding. Example embodiments, however, may not be limited thereto. For example, the bonding metals may also be or alternatively formed of aluminum (Al) and/or tungsten (W).

Each of the peripheral circuit region PERI and the cell region CELL of the memory device 2000 may include an external pad bonding area PA, a word-line bonding area WLBA, and a bit-line bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. In some example embodiments, the first metal layers 2230a, 2230b, and 2230c may be formed of tungsten having relatively high electrical resistivity, and the second metal layers 2240a, 2240b, and 2240c may be formed of copper having relatively low electrical resistivity.

In some example embodiments illustrated in FIG. 23, although only the first metal layers 2230a, 2230b, and 2230c and the second metal layers 2240a, 2240b, and 2240c are shown and described, example embodiments are not limited thereto, and one or more additional metal layers may be further formed on the second metal layers 2240a, 2240b, and 2240c. At least a portion of the one or more additional metal layers formed on the second metal layers 2240a, 2240b, and 2240c may be formed of aluminum or the like having a lower electrical resistivity than those of copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as at least one of silicon oxide, silicon nitride, or the like.

Lower bonding metals 2271b and 2272b may be formed on the second metal layer 2240b in the word-line bonding area WLBA. In the word-line bonding area WLBA, the lower bonding metals 2271b and 2272b in the peripheral circuit region PERI may be electrically bonded to upper bonding metals 2371b and 2372b of the cell region CELL. The lower bonding metals 2271b and 2272b and the upper bonding metals 2371b and 2372b may be formed of at least one of aluminum, copper, tungsten, or the like. Further, the upper bonding metals 2371b and 2372b in the cell region CELL may be referred as first metal pads and the lower bonding metals 2271b and 2272b in the peripheral circuit region PERI may be referred as second metal pads.

The cell region CELL may include at least one memory block. The cell region CELL may include a second substrate 2310 and a common source line 2320. On the second substrate 2310, a plurality of word-lines 2331, 2332, 2333, 2334, 2335, 2336, 2337, and 2338 (e.g., 2330) may be stacked in a third direction D3 (e.g., a Z-axis direction), perpendicular to an upper surface of the second substrate 2310. At least one string selection line and at least one ground selection line may be arranged on and below the plurality of word-lines 2330, respectively, and the plurality of word-lines 2330 may be disposed between the at least one string selection line and the at least one ground selection line.

In the bit-line bonding area BLBA, a channel structure CH may extend in the third direction D3 (e.g., the Z-axis direction), perpendicular to the upper surface of the second substrate 2310, and pass through the plurality of word-lines 2330, the at least one string selection line, and the at least one ground selection line. The channel structure CH may include a data storage layer, a channel layer, a buried insulating layer, and the like, and the channel layer may be electrically connected to a first metal layer 2350c and a second metal layer 2360c. For example, the first metal layer 2350c may be a bit-line contact, and the second metal layer 2360c may be a bit-line. In some example embodiments, the bit-line 2360c may extend in a second direction D2 (e.g., a Y-axis direction), parallel to the upper surface of the second substrate 2310.

In some example embodiments illustrated in FIG. 23, an area in which the channel structure CH, the bit-line 2360c, and the like are disposed may be defined as the bit-line bonding area BLBA. In the bit-line bonding area BLBA, the bit-line 2360c may be electrically connected to the circuit elements 2220c providing a page buffer 2393 in the peripheral circuit region PERI. The bit-line 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer 2393.

In the word-line bonding area WLBA, the plurality of word-lines 2330 may extend in a first direction D1 (e.g., an X-axis direction), parallel to the upper surface of the second substrate 2310 and perpendicular to the second direction D2, and may be connected to a plurality of cell contact plugs 2341, 2342, 2343, 2344, 2345, 2346, and 2347 (e.g., 2340). The plurality of word-lines 2330 and the plurality of cell contact plugs 2340 may be connected to each other in pads provided by at least a portion of the plurality of word-lines 2330 extending in different lengths in the first direction D1. A first metal layer 2350b and a second metal layer 2360b may be connected to an upper portion of the plurality of cell contact plugs 2340 connected to the plurality of word-lines 2330, sequentially. The plurality of cell contact plugs 2340 may be connected to the peripheral circuit region PERI by the upper bonding metals 2371b and 2372b of the cell region CELL and the lower bonding metals 2271b and 2272b of the peripheral circuit region PERI in the word-line bonding area WLBA.

The plurality of cell contact plugs 2340 may be electrically connected to the circuit elements 2220b forming a row decoder 2394 in the peripheral circuit region PERI. In some example embodiments, operating voltages of the circuit elements 2220b forming the row decoder 2394 may be different from operating voltages of the circuit elements 2220c forming the page buffer 2393. For example, operating voltages of the circuit elements 2220c forming the page buffer 2393 may be greater than operating voltages of the circuit elements 2220b forming the row decoder 2394.

A common source line contact plug 2380 may be disposed in the external pad bonding area PA. The common source line contact plug 2380 may be formed of a conductive material such as a metal, a metal compound, polysilicon, or the like, and may be electrically connected to the common source line 2320. A first metal layer 2350a and a second metal layer 2360a may be stacked on an upper portion of the common source line contact plug 2380, sequentially. For example, an area in which the common source line contact plug 2380, the first metal layer 2350a, and the second metal layer 2360a are disposed may be defined as the external pad bonding area PA.

Input/output pads 2205 and 2305 may be disposed in the external pad bonding area PA. A lower insulating film 2201 covering a lower surface of the first substrate 2210 may be formed below the first substrate 2210, and a first input/output pad 2205 may be formed on the lower insulating film 2201. The first input/output pad 2205 may be connected to at least one of the plurality of circuit elements 2220a, 2220b, and 2220c disposed in the peripheral circuit region PERI through a first input/output contact plug 2203, and may be separated from the first substrate 2210 by the lower insulating film 2201. In addition, a side insulating film (not illustrated) may be disposed between the first input/output contact plug 2203 and the first substrate 2210 to electrically separate the first input/output contact plug 2203 and the first substrate 2210.

An upper insulating film 2301 covering the upper surface of the second substrate 2310 may be formed on the second substrate 2310, and a second input/output pad 2305 may be disposed on the upper insulating layer 2301. The second input/output pad 2305 may be connected to at least one of the plurality of circuit elements 2220a, 2220b, and 2220c disposed in the peripheral circuit region PERI through a second input/output contact plug 2303. In example embodiments, the second input/output pad 2305 is electrically connected to a circuit element 2220a.

According to some example embodiments, the second substrate 2310 and the common source line 2320 may not be disposed in an area in which the second input/output contact plug 2303 is disposed. Also, the second input/output pad 2305 may not overlap the word-lines 2330 in the third direction D3 (e.g., the Z-axis direction). The second input/output contact plug 2303 may be separated from the second substrate 2310 in the direction, parallel to the upper surface of the second substrate 310, and may pass through the interlayer insulating layer 2315 of the cell region CELL to be connected to the second input/output pad 2305.

According to some example embodiments, the first input/output pad 2205 and the second input/output pad 2305 may be selectively formed. For example, the memory device 2000 may include only the first input/output pad 2205 disposed on the first substrate 2210 or the second input/output pad 2305 disposed on the second substrate 2310. Alternatively, the memory device 200 may include both the first input/output pad 2205 and the second input/output pad 2305.

A metal pattern provided on an uppermost metal layer may be provided as a dummy pattern (e.g. an electrically inactive pattern) or the uppermost metal layer may be absent, in each of the external pad bonding area PA and the bit-line bonding area BLBA, respectively included in the cell region CELL and the peripheral circuit region PERI.

In the external pad bonding area PA, the memory device 2000 may include a lower metal pattern 2273a, corresponding to an upper metal pattern 2372a formed in an uppermost metal layer of the cell region CELL, and having the same or similar cross-sectional shape as the upper metal pattern 2372a of the cell region CELL so as to be connected to each other, in an uppermost metal layer of the peripheral circuit region PERI. In the peripheral circuit region PERI, the lower metal pattern 2273a formed in the uppermost metal layer of the peripheral circuit region PERI may not be connected to a contact. Similarly, in the external pad bonding area PA, an upper metal pattern 2372a, corresponding to the lower metal pattern 2273a formed in an uppermost metal layer of the peripheral circuit region PERI, and having the same shape as a lower metal pattern 2273a of the peripheral circuit region PERI, may be formed in an uppermost metal layer of the cell region CELL.

The lower bonding metals 2271b and 2272b may be formed on the second metal layer 2240b in the word-line bonding area WLBA. In the word-line bonding area WLBA, the lower bonding metals 2271b and 2272b of the peripheral circuit region PERI may be electrically connected to the upper bonding metals 2371b and 2372b of the cell region CELL by a Cu-to-Cu bonding.

Further, in the bit-line bonding area BLBA, an upper metal pattern 2392, corresponding to a lower metal pattern 2252 formed in the uppermost metal layer of the peripheral circuit region PERI, and having the same cross-sectional shape as the lower metal pattern 2252 of the peripheral circuit region PERI, may be formed in an uppermost metal layer of the cell region CELL. A contact may not be formed on the upper metal pattern 2392 formed in the uppermost metal layer of the cell region CELL.

In some example embodiments, corresponding to a metal pattern formed in an uppermost metal layer in one of the cell region CELL and the peripheral circuit region PERI, a reinforcement metal pattern having the same or similar cross-sectional shape as the metal pattern may be formed in an uppermost metal layer in the other one of the cell region CELL and the peripheral circuit region PERI. A contact may not be formed on the reinforcement metal pattern.

The word-line voltages may be applied to at least one memory block in the cell region CELL through the lower bonding metals 2271b and 2272b in the peripheral circuit region PERI and upper bonding metals 2371b and 2372b of the cell region CELL. A selected word-line and unselected word-lines of the at least one memory block may be recovered to an initial voltage after voltages of the selected word-line and the unselected word-lines are lowered to a negative level during a program recovery period.

A nonvolatile memory device and/or a storage device according to some example embodiments may be packaged using various package types or package configurations.

Inventive concepts may be applied to various devices and systems that include the nonvolatile memory devices. For example, inventive concepts may be applied to systems such as at least one of a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

Any of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The foregoing descriptions are illustrative of some example embodiments and are not to be construed as limiting thereof. Although a few example embodiments have been described, those of ordinary skill in the art will readily appreciate that many modifications are possible in the example embodiments without materially departing from the novel teachings and advantages of inventive concepts. Accordingly, all such modifications are intended to be included within the scope of inventive concepts as defined in the claims.

What is claimed is:

1. A nonvolatile memory device comprising:
   at least one memory block including a plurality of cell strings, each of the plurality of cell strings including a string selection transistor, a plurality of memory cells, and a ground selection transistor, the string selection transistor, the plurality of memory cells, and the ground selection transistors between a source line and a bit-line and connected in series in a vertical direction; and
   a control circuitry configured to control a program operation by,
   precharging channels of the plurality of cell strings to a first voltage during a bit-line set-up period of a program loop,
   applying a program voltage to a selected word-line of the plurality of cell strings during a program execution period of the program loop, and
   after recovering voltages of the selected word-line and of unselected word-lines of the plurality of cell strings to a voltage less than a ground voltage, recovering the voltages of the selected word-line and of the unselected word-lines to a second voltage greater than the ground voltage during a recovery period of the program loop.

2. The nonvolatile memory device of claim 1, further comprising:
   a voltage generator circuitry configured to generate word-line voltages based on a control signal; and
   an address decoder circuitry configured to provide the word-line voltages to the at least one memory block,
   wherein the control circuitry is configured to control the voltage generator and the address decoder, the controlling of the voltage generator circuitry and the address decoder circuitry based on a command and an address including an address of the selected word-line.

3. The nonvolatile memory device of claim 2, wherein the control circuitry is configured to control the voltage generator circuitry and the address decoder circuitry to apply a program pass voltage to the unselected word-lines during the program execution period.

4. The nonvolatile memory device of claim 2, wherein the control circuitry is configured to control the voltage generator circuitry and the address decoder circuitry to:
   apply a first turn-on voltage to a sting selection transistor and to a ground selection transistor of a selected cell string from among the plurality of cell strings, the first turn-on voltage applied to the selected cell string from a first time point in the bit-line set-up period to an ending time point of the bit-line set-up period; and
   apply the first turn-on voltage to a sting selection transistor and a ground selection transistor of an unselected cell string from among the plurality of cell strings, the first turn-on voltage applied to the unselected cell string from the first time point in the bit-line set-up period to a second time point in the bit-line set-up period.

5. The nonvolatile memory device of claim 4, wherein the control circuitry is configured to control the voltage generator circuitry and the address decoder circuitry to:
   apply the first turn-on voltage to the sting selection transistor and the ground selection transistor of the selected cell string, the first turn-on voltage applied to the selected cell string from the ending time point of the bit-line set-up period and during the program execution period; and
   apply the ground voltage to the sting selection transistor and the ground selection transistor of the unselected cell string, the ground voltage applied to the unselected cell string from the ending time point of the bit-line set-up period and during the program execution period.

6. The nonvolatile memory device of claim 5, wherein the control circuitry is configured to control the voltage generator circuitry and the address decoder circuitry to:
   apply the first turn-on voltage to the sting selection transistor and to the ground selection transistor of the selected cell string during the program recovery period; and
   apply a second turn-on voltage to the sting selection transistor and to the ground selection transistor of the unselected cell string during the program recovery period.

7. The nonvolatile memory device of claim 2, wherein the control circuitry is configured to control the voltage generator circuitry and the address decoder circuitry to:
   apply a first negative voltage to the selected word-line and the unselected word-lines, the first negative voltage applied to the selected word line and to the unselected word-lines from a staring time point of the program recover period to a first time point in the program recover period;
   apply the second voltage to the selected word-line, the second voltage applied to the selected word-lines from the first time point in the program recover period; and
   apply the second voltage to the unselected word-lines, the second voltage applied to the unselected word-lines from the first time point in the program recover period to a second time point in the program recover period.

8. The nonvolatile memory device of claim 2, wherein during verification read period successive to the program recover period, the control circuitry is configured to control the voltage generator circuitry and the address decoder circuitry to:
   apply a verification read voltage to the selected word-line;
   apply a verify pass read voltage to the unselected word-lines;
   apply the verify pass read voltage to a sting selection transistor and a ground selection transistor of a selected cell string from among the plurality of cell strings; and
   apply the ground voltage to a sting selection transistor of an unselected cell string from among the plurality of cell strings and to a ground selection transistor of the unselected cell string from among the plurality of cell strings.

9. The nonvolatile memory device of claim 2, wherein as a number of the program loops increases, the control circuitry is configured to control the voltage generator circuitry and the address decoder circuitry to:

step-wise decrease step a level of a second negative voltage applied to the unselected word-lines during the bit-line set-up period;

step-wise increase a level of the program voltage applied to the selected word-line during the program execution period; and maintain a level of a program pass voltage applied to the unselected word-lines during the program execution period.

10. The nonvolatile memory device of claim 2, wherein as a number of the program loops increases, the control circuitry is configured to control the voltage generator circuitry and the address decoder circuitry to:

decrease a level of a second negative voltage that is applied to the unselected word-lines by a first gap; and increase a level of the program voltage that is applied to the selected word-line by a second gap.

11. The nonvolatile memory device of claim 2, wherein the plurality of cell strings are divided into a plurality of stacks in the vertical direction, the at least one memory block further includes a plurality of intermediate switching transistors in a boundary portion between two adjacent stacks in the vertical direction, and the plurality of intermediate switching transistors are configured to perform a switching operation to control electrical connection of the plurality of cell strings, respectively, and the control circuitry is configured to control the program operation and the recovering by controlling the switching operation of the plurality of intermediate switching transistors.

12. The nonvolatile memory device of claim 11, wherein the control circuitry is configured to control the voltage generator circuitry and the address decoder circuitry to:

apply a first pass voltage to word-lines of an erased stack among the plurality of stacks while the plurality of intermediate transistors are turned on, the erased stack corresponding to a stack in which all memory cells are in an erased state; and after the first pass voltage is applied to the word-lines of the erased stack, apply a second pass voltage to word-lines of a selected stack among the plurality of stacks while the plurality of intermediate transistors are turned off, the selected stack corresponding to a stack that includes memory cells to be programmed.

13. The nonvolatile memory device of claim 12, wherein the plurality of intermediate switching transistors are configured turn on to electrically connect the channels of the erased stack to the channels of the selected stack while the first pass voltage is applied to the word-lines of the erased stack; and wherein the plurality of intermediate switching transistors are configured to electrically disconnect the channels of the erased stack with the channels of the selected stack while the second pass voltage is applied to the word-lines of the selected stack.

14. The nonvolatile memory device of claim 12, wherein the control circuitry is configured to recover the word-lines of the selected stack by controlling the switching operation of the plurality of intermediate switching transistors during the program recovery period.

15. The nonvolatile memory device of claim 14, wherein the control circuitry is configured to control the voltage generator circuitry and the address decoder circuitry to lower level of voltages of the word-lines of the selected stack from the second pass voltage to a negative voltage, to recover the level of voltages of the word-lines of the selected stack to the second voltage, and then to turn-off the plurality of intermediate switching transistors during the program recovery period.

16. The nonvolatile memory device of claim 14, wherein the control circuitry is configured to control the voltage generator circuitry and the address decoder circuitry to lower level of voltages of the word-lines of the selected stack from the second pass voltage to a negative voltage while maintaining voltages of the word-lines of the erased stack at the first pass voltage during the program recovery period.

17. The nonvolatile memory device of claim 1, further comprising:

a memory cell region including the at least one memory block and a first metal pad; and a peripheral circuit region including the control circuitry and a second metal pad, the peripheral circuit region being connected to the memory cell region through the second metal pad and the first metal pad, wherein the peripheral circuit region further includes, a voltage generator circuitry configured to generate word-line voltages based on a control signal, and an address decoder circuitry configured to provide the word-line voltages to the at least one memory block, and wherein the address decoder circuitry is configured to apply the program voltage, the first voltage, and the second voltage to the at least one memory block region through the second metal pad and through the first metal pad.

18. A method of programming in a nonvolatile memory device which includes at least one memory block including a plurality of cell strings, each of the plurality of cell strings including a string selection transistor, a plurality of memory cells, and a ground selection transistor, the string selection transistor, the plurality of memory cells, and the ground selection transistor connected in series in a vertical direction between a source line and a bit-line, the method comprising:

precharging channels of the plurality of cell strings to a first voltage during a bit-line set-up period of a program loop;

applying a program voltage to a selected word-line of the plurality of cell strings during a program execution period of the program loop; and recovering voltages of unselected word-lines of the plurality of cell strings to a second voltage greater than a ground voltage after lowering voltages of the selected word-line and the unselected word-line to a voltage less than the ground voltage during a recovery period of the program loop.

19. The method of claim 18, further comprising:

applying a first turn-on voltage to a sting selection transistor and to a ground selection transistor of a selected cell string from among the plurality of cell strings during a program recovery period; and applying a second first turn-on voltage to a sting selection transistor and to a ground selection transistor of an unselected cell string from among the plurality of cell strings during a program recovery period.

20. A method of programming in a nonvolatile memory device which includes at least one memory block including a plurality of cell strings, each of the plurality of cell strings including a string selection transistor, a plurality of memory cells, and a ground selection transistor, the string selection transistor, the plurality of memory cells, and the ground selection transistor connected in series in a vertical direction between a source line and a bit-line, the method comprising:

applying a second voltage to a selected word-line of the plurality of cell strings to precharge channels of the plurality of cell strings to a first voltage during a bit-line set-up period of each of a plurality of program loops;

applying the second voltage to unselected word-lines of the plurality of cell strings during a bit-line set-up period of a first program loop from among the plurality of program loops;

applying a negative voltage, which decreases in a stepwise manner as a number of the program loops increases, to the unselected word-lines of the plurality of cell strings during a bit-line set-up period of each of the plurality of program loops except the first program loop; and applying a program voltage, which increases in a stepwise manner as the number of the program loops increases, to the selected word-line of the plurality of cell strings while applying a program pass voltage having a fixed levels to the unselected word-lines of the plurality of cell strings during a program execution period of each of the plurality of program loops.

* * * * *